United States Patent
Duvnjak

(10) Patent No.: US 11,437,911 B2
(45) Date of Patent: Sep. 6, 2022

(54) VARIABLE DRIVE STRENGTH IN RESPONSE TO A POWER CONVERTER OPERATING CONDITION

(71) Applicant: Power Integrations, Inc., San Jose, CA (US)

(72) Inventor: Rajko Duvnjak, Kanata (CA)

(73) Assignee: Power Integrations, Inc., San Jose, CA (US)

( * ) Notice: Subject to any disclaimer, the term of this patent is extended or adjusted under 35 U.S.C. 154(b) by 121 days.

(21) Appl. No.: 17/130,559

(22) Filed: Dec. 22, 2020

(65) Prior Publication Data

US 2022/0200459 A1    Jun. 23, 2022

(51) Int. Cl.
   *H02M 3/335*    (2006.01)

(52) U.S. Cl.
   CPC ... *H02M 3/33507* (2013.01); *H02M 3/33569* (2013.01)

(58) Field of Classification Search
   CPC .................. H02M 3/33507; H02M 3/33569
   See application file for complete search history.

(56) References Cited

U.S. PATENT DOCUMENTS

| | | | |
|---|---|---|---|
| 4,736,126 | A | 4/1988 | Susak |
| 4,766,366 | A | 8/1988 | Davis |
| 4,808,853 | A | 2/1989 | Taylor |
| 5,742,183 | A | 4/1998 | Kuroda |
| 5,923,209 | A | 7/1999 | Price et al. |
| 5,963,438 | A | 10/1999 | Chen |
| 6,051,893 | A | 4/2000 | Yamamoto et al. |
| 6,333,665 | B1 | 12/2001 | Toshiba |
| 6,339,309 | B1 | 1/2002 | Bixel et al. |
| 6,583,663 | B1 | 6/2003 | Disney |
| 7,034,600 | B2 | 4/2006 | Scheikl |
| 7,061,301 | B2 | 6/2006 | Pham |
| 7,233,191 | B2 | 6/2007 | Wang et al. |
| 7,239,119 | B2 | 7/2007 | Baurle et al. |
| 7,489,120 | B2 | 2/2009 | Matthew |

(Continued)

FOREIGN PATENT DOCUMENTS

| EP | 3116179 A1 | 1/2017 |
|---|---|---|
| EP | 3496348 A1 | 6/2019 |

(Continued)

*Primary Examiner* — Kyle J Moody
(74) *Attorney, Agent, or Firm* — Power Integrations, Inc.; Karina Martha G. Li

(57) ABSTRACT

A controller for a power converter comprising a drive signal generator and drive strength control and a variable strength multi-stage gate driver. The drive signal generator and drive strength control outputs a drive signal to control switching of a power switch and a strength signal to control drive strength of the power switch. The variable strength multi-stage gate driver is configured to turn ON the power switch in response to the drive signal with a first drive strength then a second drive strength when the strength signal is not asserted. The variable strength multi-stage gate driver is configured to turn ON the power switch in response to the drive signal with a third drive strength then the second drive strength when the strength signal is asserted. The second drive strength is stronger than the first drive strength and the first drive strength is stronger than the third drive strength.

16 Claims, 9 Drawing Sheets

(56) References Cited

U.S. PATENT DOCUMENTS

| | | | |
|---|---|---|---|
| 7,531,993 B2 | 5/2009 | Udrea et al. | |
| 7,535,130 B2 | 5/2009 | Djengurian et al. | |
| 7,616,459 B2 * | 11/2009 | Huynh | H02M 3/33507 |
| | | | 363/41 |
| 8,144,484 B2 | 3/2012 | Disney | |
| 8,207,760 B2 | 6/2012 | Pham | |
| 8,264,858 B2 | 9/2012 | Disney | |
| 8,456,218 B2 | 6/2013 | Mazzola et al. | |
| 8,466,735 B2 | 6/2013 | Kelley | |
| 8,985,850 B1 * | 3/2015 | Godbole | G01K 13/00 |
| | | | 374/178 |
| 9,019,001 B2 | 4/2015 | Kelley et al. | |
| 9,366,717 B2 | 6/2016 | Ratz | |
| 9,543,821 B2 | 1/2017 | Odell et al. | |
| 9,750,102 B1 | 8/2017 | Mao et al. | |
| 9,825,625 B2 | 11/2017 | Thalheim | |
| 9,954,461 B1 | 4/2018 | Duvnjak | |
| 9,983,239 B2 | 5/2018 | Mayell | |
| 10,038,439 B2 | 7/2018 | Siebler | |
| 10,171,071 B2 | 1/2019 | Ratz | |
| 10,181,813 B2 | 1/2019 | Baurle et al. | |
| 10,384,561 B2 | 8/2019 | Yang et al. | |
| 11,223,270 B2 * | 1/2022 | Rajesh | H02M 3/33523 |
| 2004/0036511 A1 | 2/2004 | Otoshi et al. | |
| 2012/0206123 A1 | 8/2012 | Mulligan et al. | |
| 2015/0326008 A1 | 11/2015 | Bäurle et al. | |
| 2016/0329751 A1 | 11/2016 | Mach et al. | |
| 2018/0123579 A1 | 5/2018 | Fink et al. | |
| 2018/0302017 A1 | 10/2018 | Baurle et al. | |
| 2021/0091701 A1 | 3/2021 | Baeurle | |

FOREIGN PATENT DOCUMENTS

| | | |
|---|---|---|
| WO | 2011149632 A2 | 12/2011 |
| WO | 2018080508 A1 | 5/2018 |

* cited by examiner

VARIABLE DRIVE STRENGTH IN RESPONSE TO A POWER CONVERTER OPERATING CONDITION

BACKGROUND OF THE INVENTION

Field of the Invention

The present invention relates generally to power converters, and more specifically to power converters operating in continuous conduction mode (CCM).

Discussion of the Related Art

Electronic devices use power to operate. Switched mode power converters are commonly used due to their high efficiency, small size, and low weight to power may of today's electronics. Conventional wall sockets provide a high voltage alternating current. In a switching power converter, the high voltage alternating current (ac) input is converted to provide a well-regulated direct current (dc) output through an energy transfer element. The switched mode power converter usually provides output regulation by sensing one or more inputs representative of one or more output quantities and controlling the output in a closed loop. In operation, a switch is utilized to provide the desired output by varying the duty cycle (typically the ratio of the on-time of the switch to the total switching period), varying the switching frequency, or varying the number of pulses per unit time of the switch in a switched mode power converter.

When designing electronic equipment, regulatory agencies have set several specifications or standards which should be met. The electrical outlet provides an ac voltage that has a waveform conforming to standards of magnitude, frequency and harmonic content to electrical equipment. However the current drawn from the outlet is determined by the characteristics of the electrical equipment which receives the ac voltage. Regulatory agencies set standards for particular characteristics of the current that may be drawn from the ac electrical outlet.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
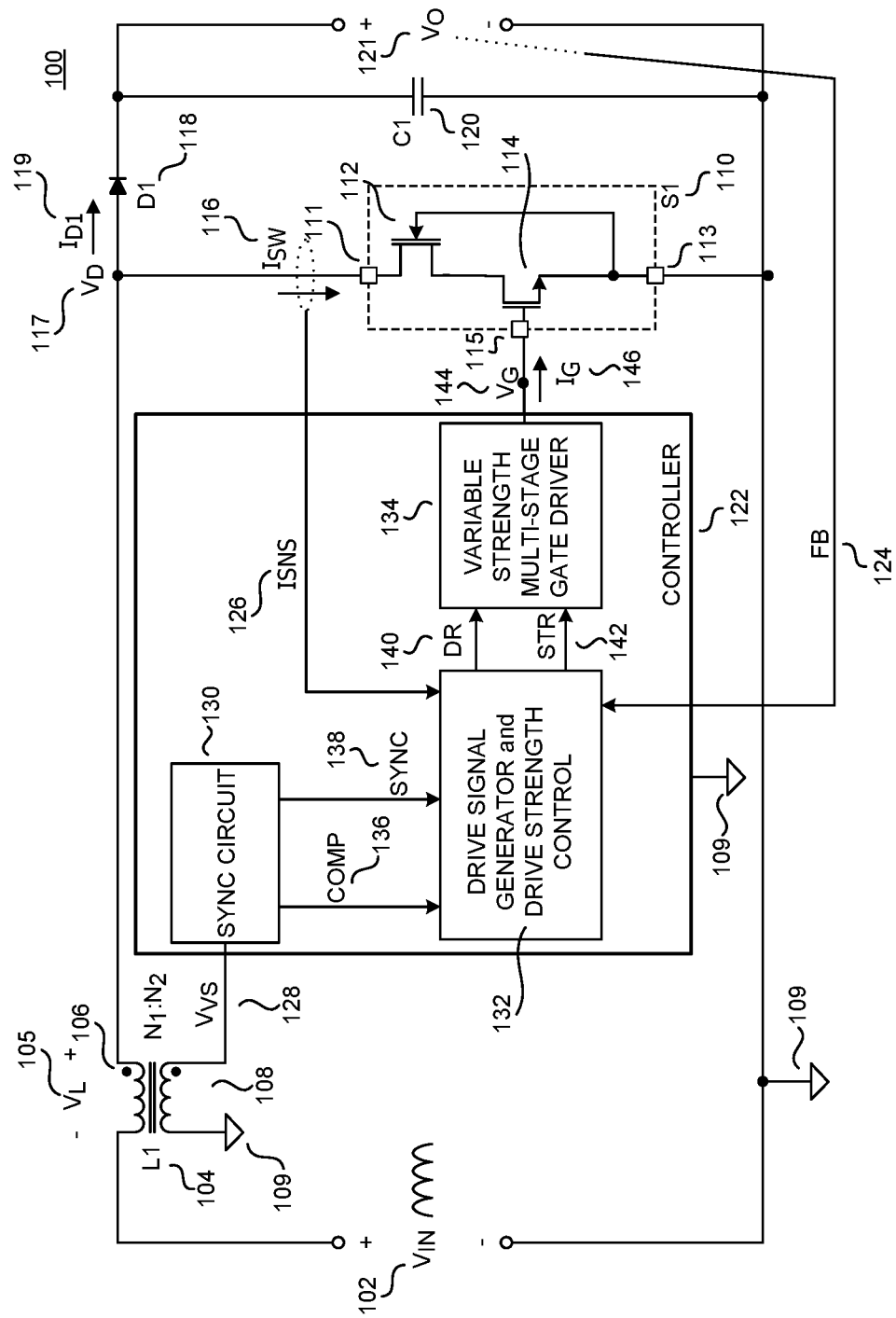
FIG. 1A is a schematic illustrating a power converter and controller with a variable strength multi-stage gate driver, in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Regulatory agencies set standards for particular characteristics of the current that may be drawn from the ac electrical outlet. For example, a standard may set limits on the magnitudes of specific frequency components of the ac current. In another example, a standard may limit the rms value of the current in accordance with the amount of power which the outlet provides. One standard places limits on the power factor correction (PFC) which should be included for electronic devices. Power factor is particularly important for power distribution systems. When electronic equipment (such as a power converter) has less than unity power factor, power utilities would need to provide the electrical equipment with more current than electrical equipment with unity power factor. By employing PFC, power utilities may avoid the need for extra capacity to deliver current. The power factor has a value between zero and one with unity power factor as the ideal case. Generally, a PFC circuit shapes the input current waveform as closely to the input voltage waveform in an attempt to achieve unity power factor.

Switched-mode power converters are examples of electrical equipment which utilize a PFC circuit. In general, a power converter receives an input from an ordinary electrical outlet. One or more switches in the power converter are switched ON and OFF by a control circuit to provide a regulated output. Since the power converter which receives the ac voltage determines the characteristics of the ac current, power converters often use active circuits at their inputs to maintain a high power factor. Power factor corrected power converters may be designed in two stages. The first stage is the PFC circuit which attempts to shape the input current waveform to achieve unity power factor and the second stage is the switched-mode power converter which provides a regulated output.

A step-up converter, such as a boost converter, may be utilized as a PFC circuit. A boost converter includes an energy transfer element, a power switch, and a diode, also referred to as a boost diode. The power switch is controlled ON for an on-time and controlled OFF for an off-time by a controller to transfer energy from the input to the output of the boost converter. A switch that is ON may conduct current while a switch that is OFF cannot conduct current.

For boost converters operating in discontinuous conduction mode (DCM) or critical conduction mode (CrM), there is substantially no current in the boost diode at the end of the off-time of the power switch and the power switch is turned ON with substantially zero current. For a boost converter operating in DCM or CrM, a boost diode with relatively slow reverse recovery time could be utilized. Diodes with slower reverse recovery times generally have lower forward voltage and lower conduction losses compared with diodes with faster recovery times and larger forward voltage. As such, for a boost converter operating mainly in DCM or CrM, a boost diode with relatively slow reverse recovery could be utilized to minimize conduction losses and improve efficiency of the power converter. Further, diodes with slower reverse recovery times are generally cheaper than their faster counterparts.

Although a boost converter may be designed to operate mainly in DCM or CrM, there are conditions when the boost converter is operating in continuous conduction mode (CCM), such as start-up or heavy loads. However, when a boost converter is operating in CCM, there is substantially non-zero current in the boost diode at the end of the off-time of the power switch and the power switch is turned ON with substantially non-zero current. If the boost converter is utilizing a relatively slow reverse recovery diode, the slow recovery time of the boost diode can cause large reverse recovery currents and a large current spike at the beginning of the on-time of the power switch. In general, the amplitude of the reverse recovery current of diodes with slower recovery is proportional to the rate of the current change (di/dt) during diode recovery. In other words, the power switch could experience a large current at turn on and the amplitude of this current may depend on the rate of the current change (di/dt) during turn-on time and diode recovery. These large currents can temporarily increase switching losses and generated noise of the power converter.

The time for the power switch to transition from an OFF state to an ON state is referred to as the turn-on time. Switching (otherwise also referred to as crossover) losses occur during this transition time and shorter turn-on times generally correspond with reduced switching losses and temperature. However, shorter turn-on times may also correspond with increases system level electromagnetic interference (EMI) and larger current spike of the power switch due to the slow reverse recovery of the boost diode. As such, increasing the turn-on time of the power switch can decrease the current rise (di/dt) of the power switch during the turn-on time and thus reduce the current spike caused by the slow reverse recovery of the boost diode.

The turn-on time of the power switch may be varied by varying the drive strength to turn ON the power switch. It should be appreciated that a power switch may be a voltage controlled device or a current controlled device at its control terminal, also referred to as a gate terminal or base terminal. Voltage controlled power switches are typically controlled with a voltage source and a drive resistor and the drive current for the power switch is determined by the voltage drop across the control resistor. In other words, the value of the voltage source and the voltage drop determines the drive current and the resultant turn-on time of the power switch. Current controlled power switches could be controlled by a current source and the drive current of the power switch is determined by the charge delivered by the current source. Drive current may also be referred to as drive strength with lower magnitudes of drive current corresponding to lower drive strength. Further, for a voltage controlled power switch, the greater voltage drop across the control resistor would correspond with a smaller drive current and lower drive strength. In other words, the rate of change of voltage at the control terminal of the power switch may be determined by the drive strength and slower rates of change of voltage at the control terminal corresponding to lower drive strength. Drive currents of lower magnitudes may correspond to longer turn-on times and can decrease the current rise (di/dt) of the power switch during turn-on time and thus reduce the amplitude of the current spike caused by the slow reverse recovery of the boost diode.

Embodiments of the present disclosure includes a gate driver which varies the drive strength of a power switch under detected operating conditions of the power converter, such as DCM, CrM and CCM. Further, embodiments disclose a gate driver which reduces drive strength under detected conditions, such as CCM, to reduce the current rise during turn-on of the power switch. Under normal operating conditions, such as DCM or CrM, the gate driver may be a multi-stage gate driver, in which the power switch is driven with different drive strengths during the turn-on of the power switch. For example, the multi-stage gate driver may turn ON the power switch with a first drive strength during a first stage of gate drive and then turn ON the power switch with a second drive strength during a second stage of gate drive. The second stage of the gate drive immediately follows the first stage. Further, the second drive strength is greater than the first drive strength, e.g. the second drive strength provides greater drive current than the first drive strength to turn ON the power switch. When the power converter is operating in CCM, the controller for the power converter detects the CCM operation and varies the drive strength of the first stage of gate drive of the power switch. In one embodiment, multi-stage gate driver may turn ON the power switch with a third drive strength during the first stage of gate drive and then turn ON the power switch with the second drive strength. The third drive strength is weaker than the first drive strength, e.g. the third drive strength provides less drive current than the first drive strength to turn ON the power switch.

Referring first to FIG. 1A, a schematic of a power converter 100 with a controller 122 including a variable strength multi-stage gate driver 134, in accordance with an embodiment of the present disclosure. FIG. 1A illustrates an input voltage $V_{IN}$ 102, energy transfer element L1 104, power switch S1 110, output rectifier D1 118, output capacitor C1 120, an output voltage $V_O$ 121 and a controller 122. The controller 122 is shown as including a synchronization circuit 130, drive signal generator and drive strength control 132, and a variable strength multi-stage gate driver 134. The power switch S1 110 is shown as a cascode switch (or a hybrid switch) including a first terminal 111, second terminal 113, a control terminal 115, a first cascode switch 112 (generally a normally-on device) and a second cascode switch 114 (generally a normally-off device). Further shown in FIG. 1A are inductor voltage $V_L$ 105, switch current $I_{SE}$ 116, first terminal voltage $V_D$ 117, diode current $I_{D1}$ 119, feedback signal FB 124, voltage sense signal $V_{VS}$ 128, current sense signal ISNS 126, comparison signal COMP 136, extremum signal SYNC 138, drive signal DR 140, strength signal STR 143, control voltage $V_G$ 144, and drive current $I_G$ 146. The example power converter 100 is shown as a boost converter, however it should be appreciated that other converter topologies may be utilized with embodiments of the present disclosure. Further, the power converter 100 is a non-isolated power converter, however it should be appreciated that isolated power converters may also be utilized with embodiments of the present disclosure.

Power converter 100 provides output voltage $V_O$ 121 from an unregulated input voltage $V_{IN}$ 102. In one embodiment, the input voltage $V_{IN}$ 102 is a rectified ac input voltage. Energy transfer element L1 104 is coupled to receive the input voltage $V_{IN}$ 102. In FIG. 1A, the energy transfer element L1 104 is shown as a coupled inductor with a first winding 106 and a sense winding 108. However, it should be appreciated that energy transfer element L1 104 may be an inductor. As shown, the first winding 106 is shown with $N_1$ number of turns while the sense winding 108 is shown with $N_2$ number of turns. The voltage across the first winding 106 is denoted as the inductor voltage $V_L$ 105. The sense winding 108 is shown as reference to input return 109 with its dot end coupled to controller 122 such that the controller 122 receives the voltage sense signal $V_{VS}$ 128 representative of the inductor voltage $V_L$ 105 of the energy transfer element L1 104. Input return 109 provides the point of lowest potential, or in other words the point of lowest voltage with respect to the input of the power converter 100. As will be discussed, voltage sense signal $V_{VS}$ 128 is representative of the input voltage $V_{IN}$ 102 when the power switch S1 110 is ON and is representative of the difference between the of the output voltage $V_O$ 121 and the input voltage $V_{IN}$ 102 when the power switch S1 110 is off.

The output diode D1 118 is coupled to energy transfer element L1 104. The first terminal 111 of the power switch S1 110 is coupled between energy transfer element L1 104 and an anode of diode D1 118. The second terminal 113 of power switch S1 110 is coupled to input return 109. For the example shown, the power switch S1 110 is shown as a hybrid switch in a cascode configuration. The first cascode switch 112 is shown as a normally-on device, such as an n-channel junction field-effect transistor (JFET). Further, the first cascode switch 112 may be a high-voltage GaN transistor. The first cascode switch 112 may also be referred to as a depletion-mode transistor. The second cascode switch 114 is shown as a normally-off device, such as an n-channel metal-oxide-semiconductor field-effect transistor (MOSFET). The second cascode switch 114 may also be referred to as an enhancement-mode transistor. Further, the first cascode switch 112 may be a high-voltage transistor (e.g. 100V or greater), while the second cascode switch 114 may be a low-voltage transistor (e.g. 100V or less).

The power switch S1 110 is shown as including three terminals, the first terminal 111, the second terminal 113, and a control terminal 115. It should be appreciated that the first terminal 111 may be referred to as a drain terminal, the second terminal 113 as a source terminal, and the control terminal 115 as a gate terminal. As shown, gate terminal and source terminal of the second cascode switch 114 are the control terminal 115 and second terminal 113, respectively, of the power switch S1 110. The drain of the first cascode switch 112 is the first terminal of the power switch S1 110. Further, the source of the first cascode switch 112 is coupled to the drain of the second cascode switch 114. As shown, the gate of the first cascode switch 112 is also coupled to the second terminal 113. In other words, the gate of the first cascode switch 112 is coupled to input return 109. Although a power switch S1 110 is shown with a cascode configuration, it should be appreciated that the power switch S1 110 may a transistor such as a metal-oxide-semiconductor field-effect transistor (MOSFET), a bipolar junction transistor (BJT), a silicon carbide (SiC) based transistor, a gallium nitride (GaN) based transistor, or an insulated-gate bipolar transistor (IGBT).

Output diode D1 118 further couples to the output capacitor C1 120 and the output of the power converter 100. The output diode D1 118 may also be referred to as a boost diode. In one embodiment, the output diode D1 118 has a relatively slow reverse recovery time and lower forward voltage as compared to diodes with faster recovery times and larger forward voltage. Further, power converter 100 may mainly operate in DCM or CrM, where the switch current $I_{SW}$ 116 and diode current $I_{D1}$ 119 are substantially zero before the power switch S1 110 turns on. As such, an output diode D1 118 with relatively slow reverse recovery could be utilized to minimize conduction losses and improve efficiency of the power converter 100. However, as mentioned previously, when the power converter 100 operates in CCM, generally during start-up or heavy output load conditions, the substantially non-zero diode current $I_{D1}$ 119 prior to turning ON the power switch S1 110 can cause large reverse recovery currents and a large current spike at the beginning of the on-time of the power switch S1 110. As will be further discussed, in embodiments of the present disclosure, the CCM or near CCM operation is sensed by the controller 122. The controller 122 then varies the drive strength of the power switch S1 110 to reduce or prevent a large current spike of the power switch S1 110.

In the example shown in FIG. 1A, controller 122 includes several terminals for receiving and providing various signals. Controller 122 is coupled to receive feedback signal FB 124, representative of an output voltage $V_O$ 121, output current of the power converter 100, or both. It should be appreciated that an output sense circuit (not shown) may provide the feedback signal FB 124 to controller 122. As mentioned above, controller 122 is also configured to receive the voltage sense signal $V_{VS}$ 128 from sense winding 108. Further shown, the controller 122 is coupled to receive a current sense signal ISNS 126, representative of the current through the power switch S1 110 (e.g. switch current $I_{SW}$ 116). Controller 122 provides a control signal to the control terminal 115 of power switch S1 110 to control the turning ON and turning OFF of the power switch S1 110 to regulate the output of the power converter 100. As shown, the controller 122 provides a control voltage VG 144 to control the switching of power switch S1 110. The rate of change of the control voltage $V_G$ 144 determines the turn-on time of the power switch S1 110. In one example, the rate of change of the control voltage $V_G$ 144 is determined by the drive strength provided by the variable strength multi-stage gate driver 134. Drive strengths of lower magnitudes (e.g. "weaker" drive strengths) may correspond to longer turn-on times and can decrease the current rise (di/dt) of the power switch S1 110 during the turn-on time and thus reduce the amplitude of the current spike caused by the slow reverse recovery of the boost diode D1 118. In embodiments of the present disclosure, the variable strength multi-stage gate driver 134 varies the drive strength for turning ON the power switch S1 110.

In one example, the controller 122 may be formed as integrated circuit that is manufactured as either a hybrid or monolithic integrated circuit. The power switch S1 110 may also be integrated in the same integrated circuit as the controller 122 or could be formed on its own integrated circuit. Further, it should be appreciated that the controller 122 and the power switch S1 110 may be included together in a single package or may be implemented in separate packages.

Controller 122 includes a synchronization circuit 130, drive signal generator and drive strength control 132, and variable strength multi-stage gate driver 134. Synchronization circuit 130 is coupled to receive the voltage sense signal $V_{VS}$ 128 and configured to output a comparison signal COMP 136 and extremum signal SYNC 138. The voltage sense signal $V_{VS}$ 128 is representative of the inductor voltage $V_L$ 105. The inductor voltage $V_L$ 105 is the difference of the first terminal voltage $V_D$ 117 and the input voltage $V_{IN}$ 102. When the power switch S1 110 is on, voltage sense signal $V_{VS}$ 128 is representative of the input voltage $V_{IN}$ 102. For the example shown in FIG. 1A, the voltage sense signal $V_{VS}$ 128 is substantially equal to the negative value of the input voltage $V_{IN}$ 102 multiplied by the turns ratio (N2/N1) of the energy transfer element L1 104 when the power switch S1 110 is on, or mathematically:

$$V_{VS} = -V_{IN} \frac{N_2}{N_1}.$$

When the power switch S1 110 is off and the diode D1 118 conducts, the voltage sense signal $V_{VS}$ 128 is representative of the difference between the output voltage $V_O$ 121 and the input voltage $V_{IN}$ 102. For the example shown in FIG. 1A, the voltage sense signal $V_{VS}$ 128 is substantially equal to the difference between the output voltage $V_O$ 121, forward voltage of output diode D1 118, and the input voltage $V_{IN}$ 102 multiplied by turns ratio (N2/N1) of the energy transfer element L1 104 when the power switch S1 110 is off and the diode D1 118 conducts, or mathematically:

$$V_{VS} = (V_O + V_{D1} - V_{IN}) \frac{N_2}{N_1}.$$

Synchronization circuit 130 is configured to output a comparison signal COMP 136 and an extremum signal SYNC 138. In one embodiment, the synchronization circuit 130 provides information regarding the first terminal voltage $V_D$ 117 or the inductor voltage $V_L$ 105. As will be further discussed with respect to FIG. 2, FIG. 3A, and FIG. 3B, in one embodiment the synchronization circuit 130 synchronizes the controller 122 with extremums of the inductor voltage $V_L$ 105. Further, the synchronization circuit 130 provides information regarding whether the power converter 100 is operating in DCM or CCM. During DCM, the output diode D1 118 stops conducting during the off-time of the power switch S1 110. As such, ringing occurs due to parasitic capacitances, parasitic inductances, and the inductance of the energy transfer element L1 104. The ringing is generally referred to as the relaxation ring and includes "peaks" and "valleys," where mathematically, the slope (i.e., derivative of the ringing/oscillation waveform) approaches zero, also referred to as an "extremum." For a boost converter, turning ON the power switch during a valley of the relaxation ring may minimize switching losses of the power switch S1 110, referred to as "valley switching." In one example, synchronization circuit 130 provides information regarding the relaxation ring such that the controller 122 may employ valley switching during DCM. It should be appreciated that other converter topologies may benefit from "peak switching" in which the power switch is turned ON during a peak of the relaxation ring.

In one embodiment, the synchronization circuit 130 compares the voltage sense signal $V_{VS}$ 128 with a reference and outputs the comparison signal COMP 136 representative of that comparison. In one example, comparison signal COMP 136 is logic high when the voltage sense signal $V_{VS}$ 128 is greater than the reference and logic low when the voltage sense signal $V_{VS}$ 128 is less than the reference, or vice versa. The synchronization circuit 130 also outputs an extremum signal SYNC 138 representative of an extremum in the relaxation ring, such as a valley or a peak. In one embodiment, the extremum signal SYNC 138 is representative of a valley in the relaxation ring. For example, the extremum signal SYNC 138 may be a pulse waveform which quickly pulses to a logic high and returns to a logic low value, with the pulses being coincident with a sensed valley in the voltage sense signal $V_{VS}$ 128.

Drive signal generator and drive strength control 132 is coupled to receive the comparison signal COMP 136 and extremum signal SYNC 138 and configured to output the drive signal DR 140 and the strength signal STR 142. The drive signal generator and drive strength control 132 is also configured to receive the current sense signal ISNS 126 representative of the switch current ISW 116 of power switch S1 110 and the feedback signal FB 124 representative of the output voltage $V_O$ 121. The drive signal generator and drive strength control 132 determines when to turn ON and turn OFF the power switch S1 110 and outputs the drive signal DR 140 to control the switching of the power switch S1 110. The drive signal DR 140 may be a rectangular pulse waveform with varying durations of logic high and logic low sections. Logic high sections may correspond with turning ON the power switch S1 110 (e.g. the on-time) and logic low sections correspond with turning OFF the power switch (e.g. the off-time). In one embodiment, the drive signal generator and drive strength control 132 determines to turn ON the power switch S1 110 when the feedback signal FB 124 indicates that the output voltage $V_O$ 121 has fallen below a regulation reference. However, in one example the drive signal generator and drive strength control 132 does not output the drive signal DR 140 to turn ON the power switch S1 110 until a pulse in the extremum signal SYNC 138 is received indicating that the first terminal voltage $V_D$ 117 is at a valley. In one embodiment, the drive signal generator and drive strength control 132 synchronizes the turn ON of the power switch S1 110 with the second pulse in the extremum signal SYNC 138 for every switching cycle of the power switch S1 110. However, it should be appreciated that the turn ON of the power switch S1 110 may be synchronized with any detected extremum of the first terminal voltage $V_D$ 117 and/or inductor voltage $V_L$ 105.

In one example, the drive signal generator and drive strength control 132 may determine to turn OFF the power switch when the current sense signal ISNS 126 indicates that the switch current $I_{SW}$ 116 has reached a current limit. However, it should be appreciated that many regulation schemes may be utilized by the drive signal generator and drive strength control 132 to control the turn-on and turn-off of the power switch S1 110 to regulate the output of the power converter 100. As shown, the variable strength multi-stage gate driver 134 is configured to receive the drive signal DR 140 and to output the control voltage $V_G$ 144, the drive current $I_G$ 146, or both, to turn ON or turn OFF the power switch S1 110 in response to the drive signal DR 140.

Further, the drive signal generator and drive strength control 132 determines the drive strength of the power switch S1 110 and outputs the strength signal STR 142 to control the drive strength of the variable strength multi-stage gate driver 134. In one embodiment, the drive signal generator and drive strength control 132 determines the drive strength when turning ON (or turning off) the power switch S1 110. In addition, the drive signal generator and drive strength control 132 determines if the power converter is operating at or near CCM and outputs the strength signal STR 142 to vary the drive strength of the power switch S1 110. In one example, the drive signal generator and drive strength control 132 determines the power converter 100 is operating in CCM or DCM in response to the comparison signal COMP 136. At the beginning of the off-time of the power switch S1 110, the comparison signal COMP 13 is an indication of the conduction of the output diode D1 118. If the output diode D1 118 is still conducting by the completion of the maximum off-time of the power switch S1 110, the power converter 100 is operating in CCM. In one example, if the comparison signal COMP 136 indicates that the voltage sense signal $V_{VS}$ 128 is greater than the reference for the maximum off-time of the power switch S1 110, the drive signal generator and drive strength control 132 determines the power converter 100 is operating at or near CCM and asserts the strength signal STR 142 to vary the drive strength of power switch S1 110.

Variable strength multi-stage gate driver 134 outputs the control voltage $V_G$ 144 and/or drive current $I_G$ 146 to turn ON or turn OFF the power switch S1 110 in response to the drive signal DR 140. Further, the strength at which the variable strength multi-stage gate driver 134 turns ON (or off) the power switch S1 110 is responsive to the strength signal STR 142. In one embodiment of the present invention, the variable strength multi-stage gate driver 134 controls the turn ON (or turn off) of the power switch S1 110 in multiple stages. For example, the turning ON of the power switch S1 110 may be separated in multiple stages (or multiple durations) with each stage corresponding to a different drive strength to turn ON the power switch S1 110. For example, the variable strength multi-stage gate driver 134 turns ON the power switch S1 110 in two stages. The first stage begins at the beginning of turn ON of the power switch S1 110. During the first stage, the variable strength multi-stage gate driver 134 drives the turn ON with a first drive strength. After a delayed period of time, the second stage begins. During the second stage, the variable strength multi-stage gate driver 134 drives the turn ON with a second drive strength to fully turn ON the power switch S1 110. In one embodiment, the second drive strength is greater than the first drive strength. Or in other words, the second strength is "stronger" than the first drive strength. Further, the second drive strength may be referred to as "strong" drive strength while the first drive strength is referred to as "weak" drive strength.

Under normal operating conditions in which the power converter 100 is operating in DCM or CrM, the variable strength multi-stage gate driver 134 drives the power switch S1 110 with the first drive strength (e.g weak) during the first stage of turn on. However, the strength signal STR 142 may be asserted when the drive signal generator and drive strength control 132 determines the power converter 100 is operating near or at CCM. As such, the variable strength multi-stage gate driver 134 varies the drive strength during the first stage of turn ON of the power switch S1 110. For example, the variable strength multi-stage gate driver 134 drives the turn ON of the power switch S1 110 with a third drive strength during the first stage and turns ON the power switch with the second drive strength during the second stage. In one embodiment, the third drive strength is weaker than the first drive strength and the second drive strength. In other words, the third drive strength may be considered "very weak" while the first drive strength is considered "weak" and the second drive strength is considered "strong." While turn ON is discussed, it should be appreciated that turn OFF may also be driven with multiple stages and multiple strengths in accordance with embodiments of the present disclosure.

For the example shown and will be further discussed, the power switch S1 110 is shown as a voltage controlled power switch in a cascode arrangement. For a voltage controlled power switch, the turn ON and turn OFF is typically controlled with a voltage source and a drive resistor and the drive current IG 146 is determined by the voltage drop across the drive resistor. In other words, the value of the voltage source and the voltage drop determines the strength of the drive to turn ON the power switch S1 110. A larger voltage drop would correspond to a weaker drive strength while a smaller voltage drop would correspond to a stronger drive strength. For the power switch Si 110, a greater voltage drop would correspond with a smaller drive current $I_G$ 146 and a slower rate of change of the control voltage $V_G$ 144 at the control terminal 115, corresponding to a weaker drive strength. In one embodiment of the present disclosure, the variable strength multi-stage gate driver 134 could vary the resistance of the drive resistor to vary the drive strength. A larger resistance corresponds to weaker drive strength, and vice versa. In another embodiment of the present disclosure, drive strength may be varied by varying the value of the voltage source and a larger voltage would correspond to stronger drive strength, and vice versa. For the example of a current controller power switch, the drive strength could be determined by the charge delivered by a current source. Lower magnitudes of current would correspond to lower (or weaker) drive strength.

Figure 1B:
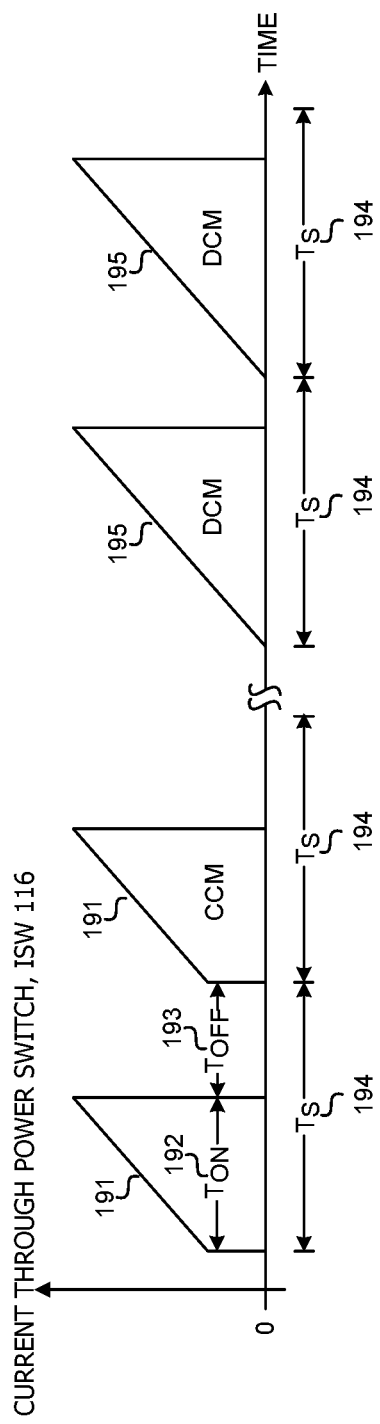
FIG. 1B is a timing diagram illustrating example current through a power switch of the power converter of FIG. 1A, in accordance with an embodiment of the present disclosure.

FIG. 1B illustrates a diagram of current $I_{SW}$ 116 through the power switch S1 110 of FIG. 1A for various modes of control including a switch on-time $T_{ON}$ 192, switch off-time $T_{OFF}$ 193, a switching period $T_S$ 194, a trapezoidal shape 191, and triangular shape 195. FIG. 1B illustrates the general waveforms of the current $I_{SW}$ 116 through the power switch S1 110 over time when the power converter is operating in in both continuous conduction mode (CCM) and discontinuous conduction mode (DCM).

During any switching period $T_S$ 194, power switch S1 110 may conduct in response to the drive signal DR 140 from the controller 122 to regulate the output of power converter 100. The switching period $T_S$ 194 may be separated into two sections of time: switch on-time $T_{ON}$ 192 and switch off-time $T_{OFF}$ 193. Switch on-time $T_{ON}$ 192 denotes the portion of the switching period $T_S$ 194 which the power switch S1 110 is conducting. Switch off-time $T_{OFF\ 193}$ denotes the remaining portion of the switching period $T_S$ 194 when the power switch S1 110 is not conducting. The current waveform of FIG. 1B shows two fundamental modes of operation. The trapezoidal shape 191 is characteristic of CCM, whereas the triangular shape 195 is characteristic of DCM. During CCM, the current through the power switch S1 110 is substantially non-zero immediately after the start of the switch on-time $T_{ON}$ 192 and steadily increases throughout the switch on-time $T_{ON}$ 192 269. During DCM, the current through the power switch S1 110 is substantially zero at the beginning of the switch on-time $T_{ON}$ 192, and steadily increases from zero throughout the switch on-time $T_{ON}$ 192. FIG. 1B illustrates that during CCM, the output diode D1 118 is conducting during the entire switch off-time $T_{OFF}$ 193 and the power switch S1 110 turns on, there is non-zero current at the beginning of the switch on-time $T_{ON}$ 192. It should be appreciated that the waveforms shown in FIG. 1B is a simplification of the switch current $I_{SW}$ 116. Due to the reverse recovery characteristics of the output diode D1 118, in particular if the output diode D1 118 has relatively slow reverse recovery, a large current spike may be present on the switch current $I_{SW}$ 116 at the beginning of the switch on-time $T_{ON}$ 192. It should be appreciated that the reverse recovery of the output diode D1 118 may depend on the rate of the current rise (di/dt) of the current through power switch S1 110 during turn-on, where the larger current spike during reverse recovery of the output diode D1 118 may correspond to the larger current rise (di/dt) of the current through power switch S1 110 during turn-on, and vice versa, the smaller current spike during reverse recovery of the output diode D1 118 may correspond to the smaller current rise (di/dt) of the current through power switch S1 110 during turn-on. In embodiments of the present disclosure, by reducing the drive strength of the power switch S1 110 during the first stage of turn-on, the current rise (di/dt) of the current through power switch S1 110 is reduced and the amplitude of the current spike may be reduced.

Figure 2:
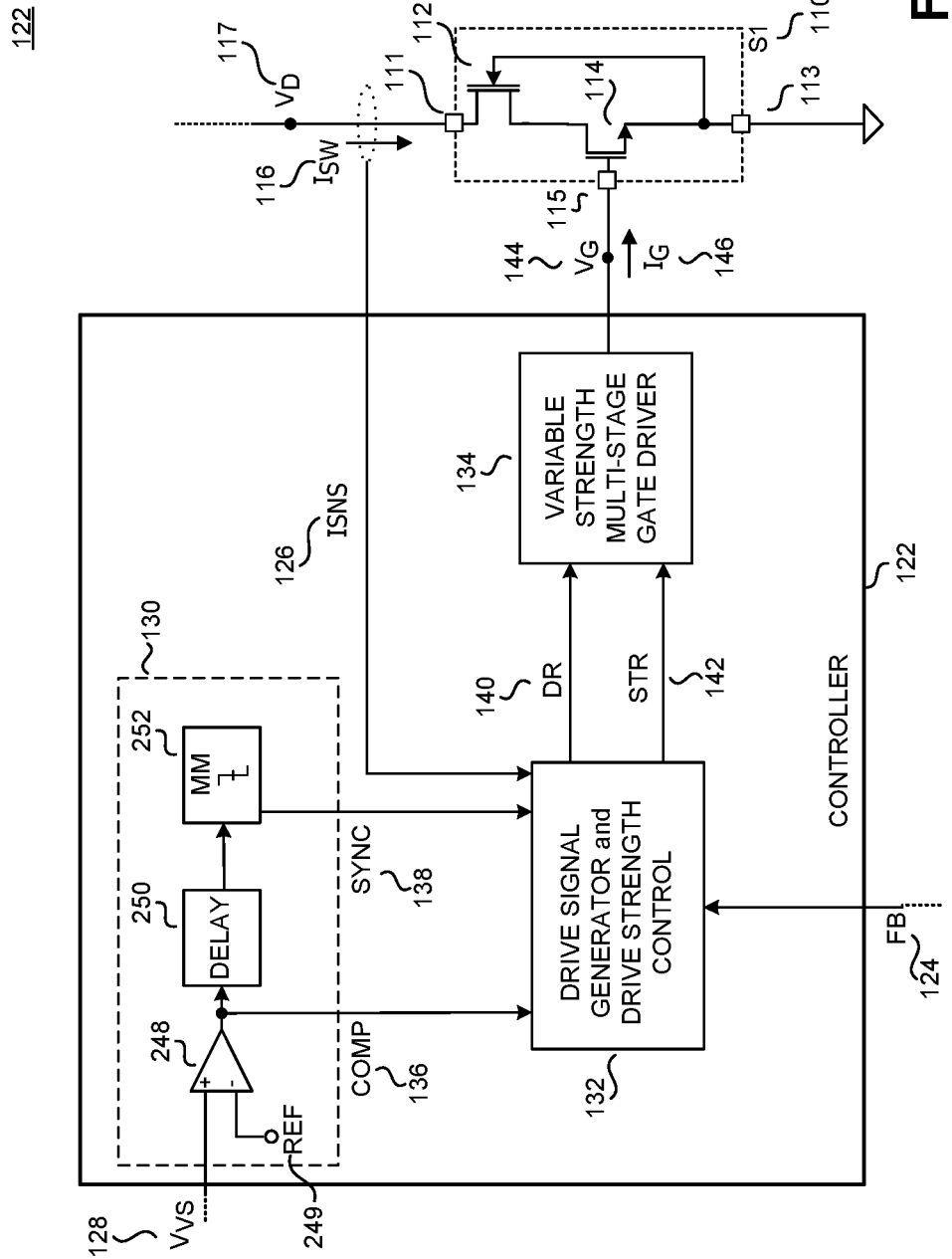
FIG. 2 is a schematic illustrating an example controller with controller with a variable strength multi-stage gate driver of FIG. 1A, in accordance with an embodiment of the present disclosure.

FIG. 2 illustrates controller 122 with variable strength multi-stage gate driver 134. In particular, FIG. 2 illustrates one example of the synchronization circuit 130. It should be appreciated that similarly named and numbered elements couple and function as described above. Further, power switch S1 110 is shown to provide context for the figure. The synchronization circuit 130 is shown as including comparator 248, delay circuit 250 and monostable multivibrator 252. As mentioned above, the synchronization circuit 130 is coupled to receive the voltage sense signal $V_{VS}$ 128 and configured to output a comparison signal COMP 136 and extremum signal SYNC 138. The voltage sense signal $V_{VS}$ 128 is representative of the voltage across the energy transfer element L1 104.

As shown, comparator 248 is configured to receive the voltage sense signal $V_{VS}$ 128 and a reference REF 249 and to output the comparison signal COMP 136. As shown, the voltage sense signal $V_{VS}$ 128 is received at the non-inverting input of comparator 248 while the reference REF 249 is received at the inverting input of comparator 248. Comparison signal COMP 36 may be a rectangular pulse waveform with logic high and logic low sections. Logic high sections corresponding to the voltage sense signal $V_{VS}$ 128 being greater than the reference REF 249 while logic low sections correspond to the voltage sense signal $V_{VS}$ 128 being less than reference REF 249.

As mentioned above, a relaxation ring occurs when the output diode D1 118 stops conducting during the off-time of the power switch S1 110 due to the parasitic capacitances, parasitic inductances, and the inductance of the energy transfer element L1 104.

Further, the synchronization circuit 130 provides information regarding whether the diode D1 118 is conducting. At the beginning of the off-time of power switch S1 110, the voltage sense signal $V_{VS}$ 128 is greater than the reference REF 249 and comparison signal COMP 136 is logic high. The voltage sense signal $V_{VS}$ 128 remains greater than the reference REF 249 until the diode D1 118 stops conducting and a relaxation ring is visible on the voltage sense signal $V_{VS}$ 128. The duration of this first logic high section during the off-time of the power switch S1 110 is the diode D1 118 conduction time. The drive signal generator and drive strength control 132 determines whether the power converter 100 is operating in CCM or DCM in response to the comparison signal COMP 136. In one example, if the comparison signal COMP 136 indicates that the voltage sense signal $V_{VS}$ 128 is greater than the reference for the maximum off-time of the power switch S1 110, the drive signal generator and drive strength control 132 determines the power converter 100 is operating at or near CCM and asserts the strength signal STR 142 to vary the drive strength of power switch S1 110.

Comparison signal COMP 136 is received by delay circuit 250, which delays the comparison signal COMP136. In one example, the duration of the delay period (TDEL 350 shown in FIG. 3A) applied by delay circuit 250 is substantially equal to one quarter of the relaxation ring period. The monostable multivibrator 252 receives the delayed comparison signal and outputs the extremum signal SYNC 138, representative of an extremum in the inductor voltage $V_L$ 105 across the energy transfer element L1 104. Or in other words, the extremum signal SYNC 138 is also representative of the relaxation ring. For the example shown, the monostable multivibrator 252 outputs a pulse in response to a falling edge in the delayed comparison signal. As such, the extremum signal SYNC 138 pulses substantially coincident with a valley of the relaxation ring as will be further shown with respect to FIG. 3A.

Figure 3A:
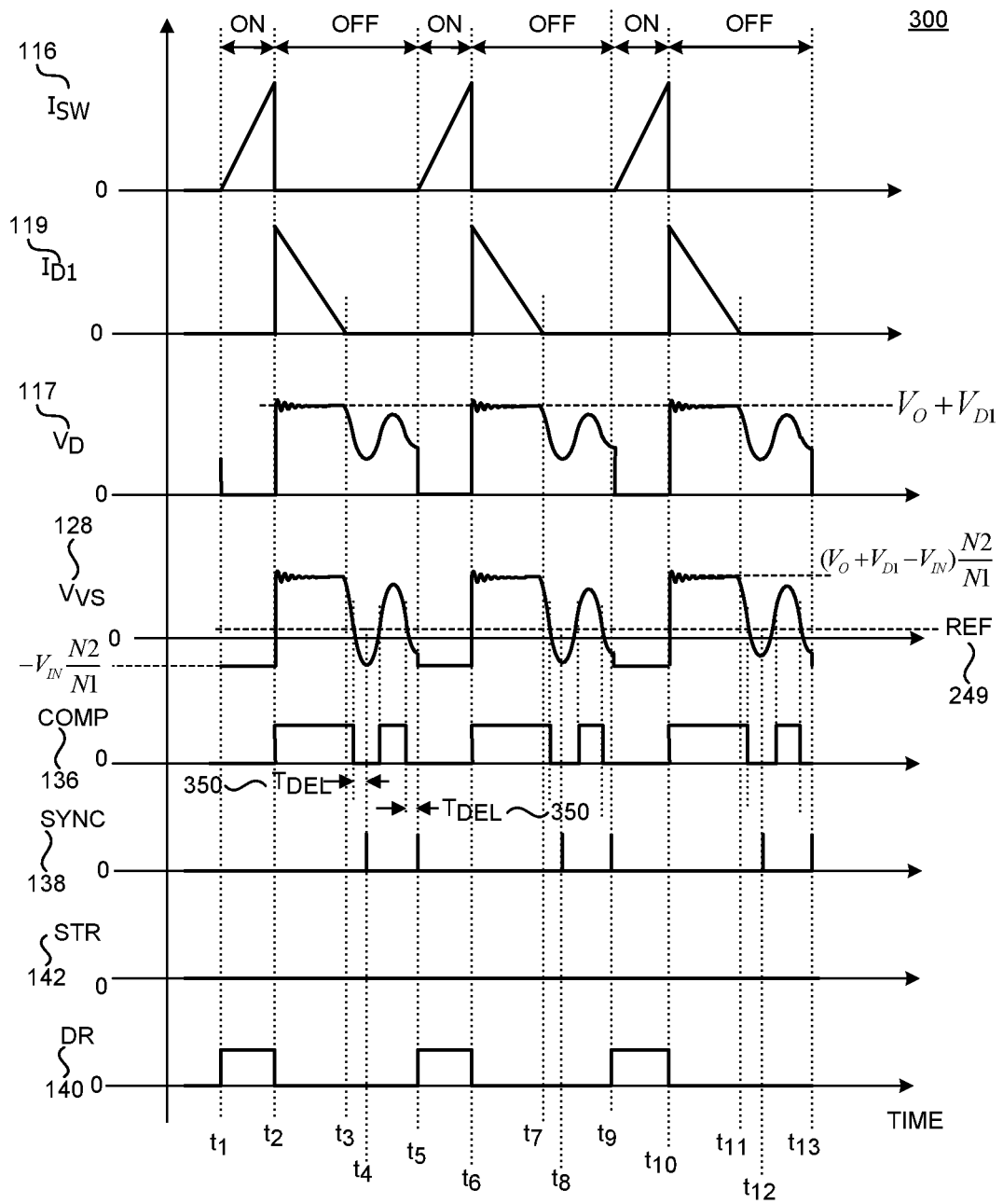
FIG. 3A is a timing diagram illustrating various example waveforms for signals of the controller shown in FIG. 2 operating in discontinuous conduction mode (DCM), in accordance with an embodiment of the present disclosure.

FIG. 3A illustrates timing diagram 300 with example waveforms of the switch current $I_{SW}$ 116, diode current $I_{D1}$ 119, first terminal voltage $V_D$ 117, voltage sense signal $V_{VS}$ 128 representative of the inductor voltage $V_L$ 105, comparison signal COMP 136, extremum signal SYNC 138, strength signal STR 142, and drive signal DR 140 shown in FIG. 1A and FIG.2 when the power converter 100 is operating in discontinuous conduction mode (DCM).

The timing diagram 300 illustrates three switching cycles of the power switch S1 110, in which the power switch S1 110 is turned ON and off. At time $t_1$, $t_5$, and $t_9$, the drive signal DR 140 is logic high, indicating to turn the power switch S1 110 on. Current from the energy transfer element L1 104 flows to the power switch S1 110. Since the power converter 100 is operating in DCM, the switch current $I_{SW}$ 116 increases from substantially zero when the power switch S1 110 begins conducting. The on-times for the power switch S1 110 are shown between times $t_1$ to $t_2$, times $t_5$ to $t_6$, and times $t_9$ to $t_{10}$. During these on-times, the diode current $I_D$ 119 and first terminal voltage $V_D$ 117 are substantially equal to zero. The voltage sense signal $V_{VS}$ 128 representative of the inductor voltage $V_L$ 105 is substantially equal to the negative of the input voltage multiplied by the turns ratio of the energy transfer element, or mathematically:

$$V_{VS} = -V_{IN}\frac{N_2}{N_1}.$$

Voltage sense signal $V_{VS}$ 128 is less than the reference REF 249 and as such the comparison signal COMP 136 is logic low and the extremum signal SYNC 138 is logic low.

At time $t_2$, $t_6$, and $t_{10}$, the drive signal DR 140 transitions to a logic low value to turn the power switch S1 110 off. Current from the energy transfer element L1 104 flows to the output diode D1 118. The output diode D1 118 begins conducting and the diode current ID1 119 decreases. Between times $t_2$ to $t_3$, times $t_6$ to $t_7$, and times $t_{10}$ to $t_{11}$, the output diode D1 110 is conducting. The first terminal voltage $V_D$ 117 is substantially equal to the sum of the output voltage $V_O$ 121 and the forward voltage drop $V_{D1}$ of the output diode D1 110. It should be appreciated that since the second terminal 113 is coupled to input return 109, the first terminal voltage $V_D$ 117 is also the power switch voltage (VDS). Further, the voltage sense signal $V_{VS}$ 128 is substantially equal to the difference between the output voltage $V_O$ 121, forward voltage of output diode D1 118, and the input voltage $V_{IN}$ 102 multiplied by turns ratio (N2/N1) of the energy transfer element L1 104 while diode D1 118 is conducting, or mathematically:

$$V_{VS} = (V_O + V_{D1} - V_{IN})\frac{N_2}{N_1}.$$

While the output diode D1 110 is conducting, the voltage sense signal $V_{VS}$ 128 is greater than the reference REF 249 and the comparison signal COMP 136 is logic high.

When the diode current $I_{D1}$ 119 reaches zero, the output diode D1 118 stops conducting and ringing occurs on the energy transfer element L1 104 and a relaxation ring is visible on the first terminal voltage $V_D$ 117 and the voltage sense signal $V_{VS}$ 128. When the voltage sense signal $V_{VS}$ 128 falls below the reference REF 249, the comparison signal COMP 136 falls to a logic low value. As mentioned above, the monostable multivibrator 252 outputs a pulse in response to a falling edge in the delayed comparison signal COMP 136. After a delay period TEL 350 (applied by delay circuit 250 shown in FIG. 2), the extremum signal SYNC 138 pulses quickly to a logic high value at times $t_4$, $t_8$, and t12. In one example, the delay period $T_{DEL}$ 350 is substantially equal to a quarter cycle of the relaxation ring. As such, the extremum signal SYNC 138 pulses are substantially coincident with an extremum of the relaxation ring. For the example shown in FIG. 3A, the extremum signal SYNC 138 pulses are substantially coincident with valleys of the relaxation ring. The comparison signal COMP 135 transitions to a logic high value when the voltage sense signal $V_{VS}$ 128 rises above the reference REF 249 and again falls to a logic low value when the voltage sense signal $V_{VS}$ 128 falls below the reference REF 249. In one example, the controller 122 synchronizes the turn ON of the power switch S1 110 with a second valley of the relaxation ring. After another delay period $T_{DEL}$ 350 the extremum signal SYNC 138 pulses to a logic high value at times $t_5$, $t_9$, and $t_{13}$. Since these pulses are the second valley pulses, the drive signal generator and drive strength control 132 asserts the drive signal DR 140 to turn ON the power switch S1 110. Between times $t_1$ and $t_{13}$, the power converter 100 is operating in DCM and the strength signal STR 142 is not asserted.

Figure 3B:
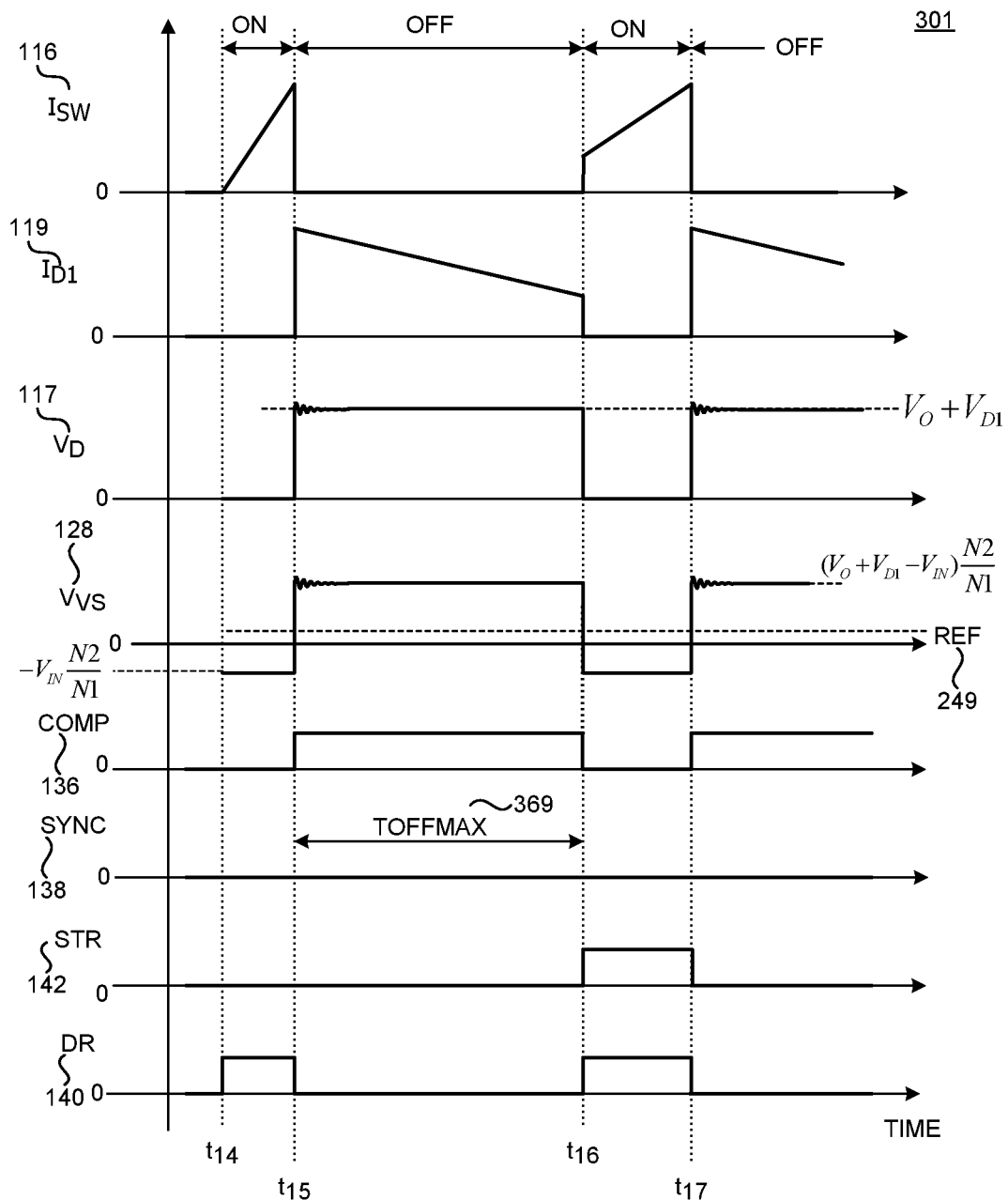
FIG. 3B is a timing diagram illustrating various example waveforms for signals of the controller shown in FIG. 2 operating in continuous conduction mode (CCM), in accordance with an embodiment of the present disclosure.

FIG. 3B illustrates timing diagram 301 with example waveforms of the switch current $I_{SW}$ 116, diode current $I_{D1}$ 119, first terminal voltage $V_D$ 117, voltage sense signal $V_{VS}$ 128 representative of the inductor voltage $V_L$ 105, comparison signal COMP 136, extremum signal SYNC 138, strength signal STR 142, and drive signal DR 140 shown in FIG. 1A and FIG.2 when the power converter 100 transitions from operating in DCM to CCM.

At time $t_{14}$, the drive signal DR 140 transitions to a logic high value to turn ON the power switch S1 110 and the switch current $I_{SW}$ 116 increases. Between times $t_{14}$ to $t_{15}$, the power switch S1 110 is ON and the diode current $I_{D1}$ 119 and first terminal voltage $V_D$ 117 are substantially equal to zero. The voltage sense signal $V_{VS}$ 128 representative of the inductor voltage $V_L$ 105 is substantially equal to the negative of the input voltage multiplied by the turns ratio of the energy transfer element, or mathematically:

$$V_{VS} = -V_{IN}\frac{N_2}{N_1}.$$

Voltage sense signal $V_{VS}$ 128 is less than the reference REF 249 and as such the comparison signal COMP 136 is logic low and the extremum signal SYNC 138 is logic low. As shown, the strength signal STR 142 has not been asserted to vary the drive strength of the power switch S1 110.

At time $t_{15}$, the drive signal DR 140 transitions to a logic low value to turn OFF the power switch S1 110, the output diode D1 118 begins conducting and the diode current $I_{D1}$ decreases. The first terminal voltage $V_D$ 117 is substantially equal to the sum of the output voltage $V_O$ 121 and the forward voltage drop $V_{D1}$ of the output diode D1 110. Further, the voltage sense signal $V_{VS}$ 128 is substantially equal to the difference between the output voltage $V_O$ 121, forward voltage of output diode D1 118, and the input voltage $V_{IN}$ 102 multiplied by turns ratio (N2/N1) of the energy transfer element L1 104, or mathematically:

$$V_{VS} = (V_O + V_{D1} - V_{IN})\frac{N_2}{N_1}.$$

Further, the voltage sense signal $V_{VS}$ 128 is greater than the reference REF 249 and the comparison signal COMP 136 is logic high while the diode D1 118 is conducting. At operating conditions, such as start up or heavy loads, the difference between the output voltage $V_O$ 121 and the input voltage $V_{IN}$ 102 is small and the rate of decrease in the diode current ID1 119 is small.

Between times $t_{15}$ and $t_{16}$, the diode D1 118 is conducting and as such the voltage sense signal $V_{VS}$ 128 remains above the reference REF 249 and the comparison signal COMP 136 is logic high. As such, there is no relaxation ring and there are no pulses in the extremum signal SYNC 138.

At time $t_{16}$, the maximum off-time TOFFMAX 369 has elapsed and the drive signal generator and drive strength control 132 outputs the drive signal DR 140 to turn ON the power switch S1 110 (e.g. logic high). As shown, at time $t_{16}$ the diode current $I_{D1}$ 119 is non-zero and diode D1 118 is still conducting and the switch current $I_{SW}$ 116 is substantially non-zero when the power switch S1 110 turns on. As such the power converter 100 is operating in CCM.

In one example, the drive signal generator and drive strength control 132 determines CCM operation in response to the comparison signal COMP 136. The comparison signal COMP 136 is logic high for the entirety of the off-time, indicating that the output diode D1 118 is conducting. When the duration of time which the comparison signal COMP 136 is logic high has reached the maximum off-time TOFFMAX 369, the drive signal generator and drive strength control 132 determines CCM operation. Or in other words, if the off-time of the power switch S1 110 has reached maximum off-time TOFFMAX 369 and the comparison signal COMP 136 is logic high, drive signal generator and drive strength control 132 determines CCM operation. As such, the drive signal generator and drive strength control 132 asserts the strength signal STR 142 to vary the drive strength of the power switch S1 110. For the example shown, the strength signal STR 142 is asserted for the next on-time of the power switch S1 110, e.g. between times $t_{16}$ and $t_{17}$. The strength signal STR 142 is deasserted at the end of the on-time at time $t_1$. The strength signal STR 142 may be reasserted if the comparison signal COMP 136 is logic high for the maximum off-time TOFFMAX 369.

In another example, the drive signal generator and drive strength control 132 determines CCM operation in response to the extremum signal SYNC 138. A shown, there are no pulses in the extremum signal SYNC 138 for the maximum off-time TOFFMAX 369. The drive signal generator and drive strength control 132 determines CCM operation and asserts the strength signal STR 142 to vary the drive strength of the power switch S1 110.

Figure 4A:
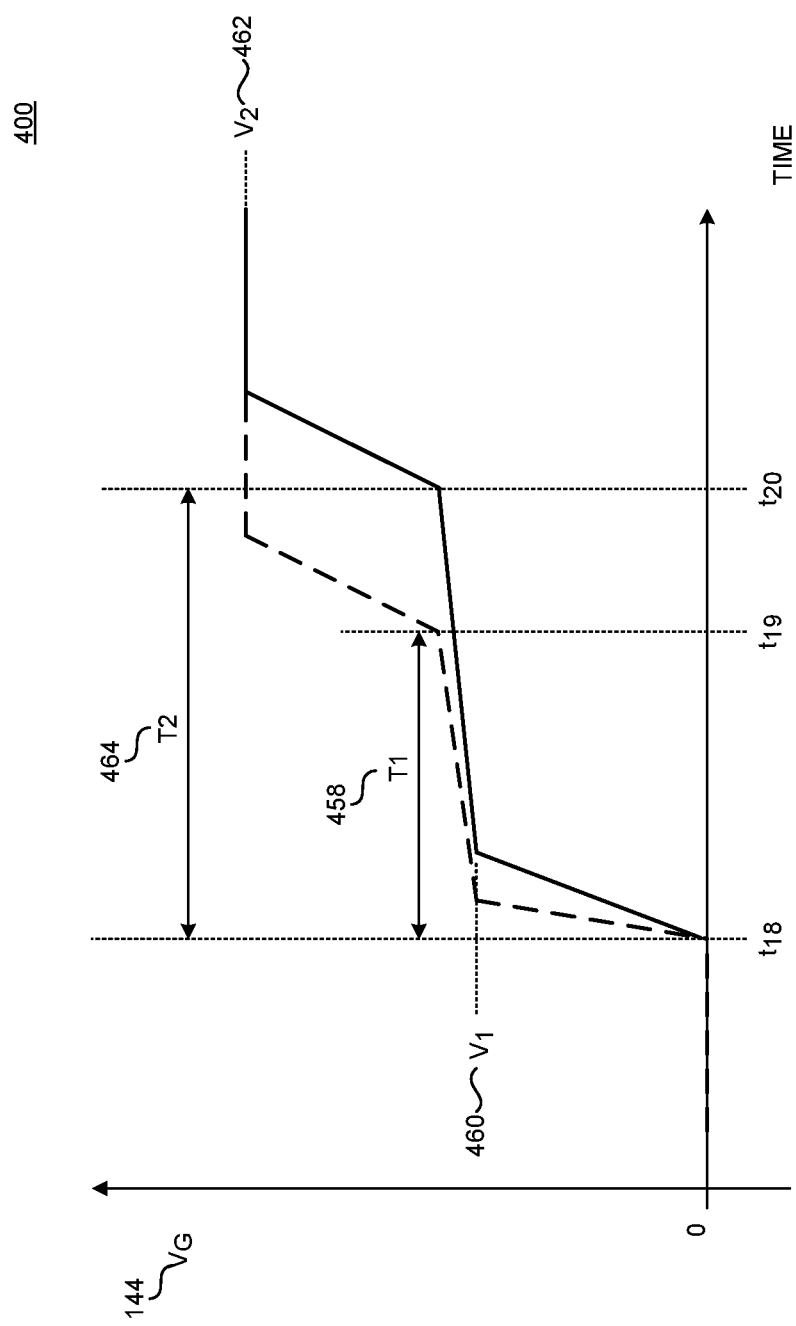
FIG. 4A is a timing diagram illustrating an example control voltage of the power switch of FIGS. 1A, and 2, in accordance with an embodiment of the present disclosure.

FIG. 4A is a timing diagram illustrating and comparing an example control voltage $V_G$ 144 (e.g. gate voltage) provided by the variable strength multi-stage gate driver 134 to control the turn ON of the power switch S1 110 when the strength signal STR 142 is not and is asserted. It should be appreciated that the example control voltage $V_G$ 144 shown is a straight line approximation.

The dashed line illustrates an example control voltage $V_G$ 144 when the strength signal STR 142 is not asserted. In other words, the power converter 100 is operating in DCM or CrM. As shown, the variable strength multi-stage gate driver 134 drives the turn ON of the power switch S1 110 in two stages. When the strength signal STR 142 is not asserted, the variable strength multi-stage gate driver 134 drives the power switch S1 110 with the first drive strength during the first stage and the second drive strength during the second stage. In one example, the variable strength multi-stage gate driver 134 provides a weak turn ON (e.g. first drive strength) during the first stage to slowly lower the EMI while the second stage provides a strong turn ON (e.g. second drive strength) after a delayed time (first time period T1 458) in order to fully turn ON the power switch S1 110 to provide accurate current sensing.

For the dashed line, at time $t_{18}$ the first stage begins and the variable strength multi-stage gate driver 134 drives the power switch S1 110 with the first drive strength (e.g. weak drive) and the control voltage $V_G$ 144 begins to rise to the threshold V1 460, which is the threshold of the second cascode switch 114. Once the control voltage $V_G$ 144 reaches the threshold V1 160, the power switch S1 110 starts to conduct. Once the threshold V1 460 is reached, the rise of the control voltage $V_G$ 144 substantially slows due to the Miller capacitance of the second cascode switch 114. After a first time period T1 458 (e.g. time $t_{19}$), the variable strength multi-stage gate driver 134 drives the power switch S1 110 with the second drive strength (e.g. strong drive). As such, for the dashed line, the first stage ends at time $t_{19}$ and the second stage begins at time $t_{19}$. At time $t_{19}$, the control voltage $V_G$ 144 begins to rise faster to the supply voltage of the variable strength multi-stage gate driver 134, shown as voltage V2 462 in FIG. 4A. However, the supply voltage of the variable strength multi-stage gate driver 134 is shown as VDD in other figures. Once the control voltage $V_G$ 144 reaches the supply voltage V2 462, the power switch S1 110 is fully ON with nominal on-time resistance ($R_{DSON}$).

The solid line illustrates an approximation of the control voltage $V_G$ 144 when the strength signal STR 142 is asserted. In other words, the power converter 100 is operating in CCM. When the strength signal STR 142 is asserted, the variable strength multi-stage gate driver 134 drives the power switch S1 110 with the third drive strength during the first stage and the second drive strength during the second stage. In one example, the variable strength multi-stage gate driver 134 provides a very weak turn ON (e.g. third drive strength) during the first stage to reduce the current rise of the switch current $I_{SW}$ 116 while the second stage provides a strong turn ON (e.g. second drive strength) after a delayed time (second time period T2 464) in order to fully turn ON the power switch S1 110 to provide accurate current sensing. In one example, the third drive strength is weaker than the first drive strength and the first drive strength is weaker than the second drive strength.

For the solid line, at time $t_{18}$ the first stage begins and the variable strength multi-stage gate driver 134 drives the power switch S1 110 with the third drive strength (e.g. very weak drive) and the control voltage $V_G$ 144 begins to rise the threshold V1 460, which is the threshold of the second cascode switch 114. Once the control voltage $V_G$ 144 reaches the threshold V1 160, the power switch S1 110 starts to conduct. As compared to the dashed line, the solid line takes longer to reach the threshold V1 460 due to the third drive strength being weaker than the first drive strength. Once the threshold V1 460 is reached, the rise of the control voltage $V_G$ 144 substantially slows due to the Miller capacitance of the second cascode switch 114. After a period T2 464 (e.g. time $t_{20}$), the variable strength multi-stage gate driver 134 drives the power switch S1 110 with the second drive strength (e.g. strong drive). As such, for the solid line, the first stage ends at time $t_{20}$ and the second stage begins at time $t_{20}$. At time $t_{20}$, the control voltage $V_G$ 144 begins to rise faster to the supply voltage of the variable strength multi-stage gate driver 134, shown as voltage V2 462 in FIG. 4A. Once the control voltage $V_G$ 144 reaches the supply voltage V2 462, the power switch S1 110 is fully ON with nominal on-time resistance ($R_{DSON}$). As shown, first time period T1 458 is shorter than second time period T2 464.

As will be discussed with respects to FIGS. 5 and 6, the drive strength provided by the variable strength multi-stage gate driver 134 may be varied by varying the drive resistance of the variable strength multi-stage gate driver 134. In one example, the drive resistance may be varied by connecting or disconnecting multiple parallel coupled drive resistances. The smaller the drive resistance, the greater the drive strength as the voltage drop across the drive resistance is smaller, which corresponds to a greater drive current $I_G$ 148 during turn-on of the power switch S1 110 and shorter turn-on time of the power switch S1 110.

Figure 4B:
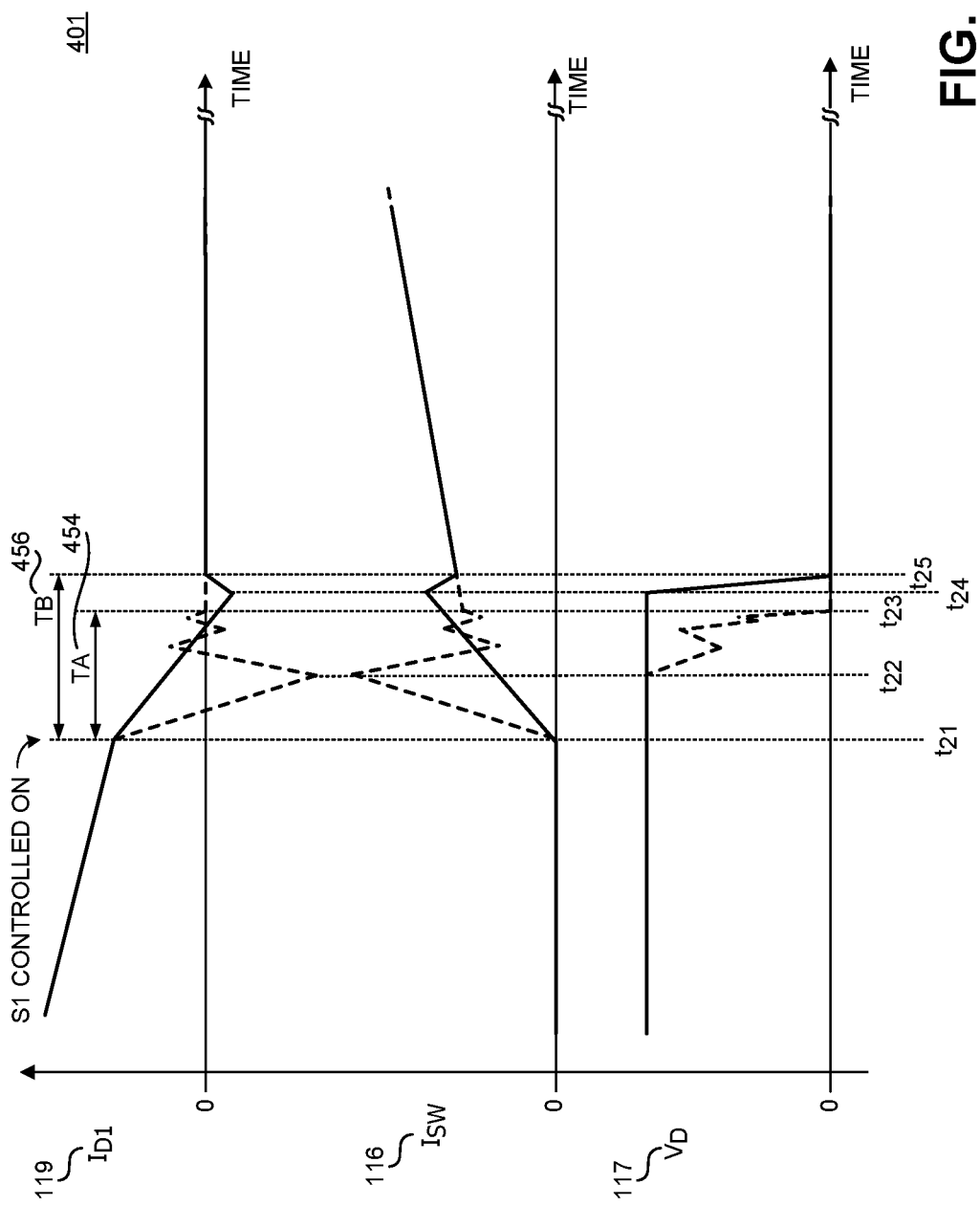
FIG. 4B is a timing diagram illustrating an example terminal voltage and current through the power switch and a diode current of FIGS. 1A and 2, in accordance with an embodiment of the present disclosure.

FIG. 4B illustrates timing diagram 401 of example waveforms for the diode current $I_{D1}$ 119, switch current $I_{SW}$ 116, and first terminal voltage $V_D$ 117 if the variable strength multi-stage gate driver 134 varies or does not vary the drive strength of the first stage of turn ON of the power switch S1 110 under the same operating conditions. It should be appreciated that the example waveforms for FIG. 4B straight line approximations. FIG. 4B particularly illustrates the current spike on the switch current $I_{SW}$ 116 if the drive strength during the first stage of gate drive is not reduced.

The dashed lines illustrate the diode current $I_{D1}$ 119, switch current $I_{SW}$ 116, and first terminal voltage $V_D$ 117 when the variable strength multi-stage gate driver 134 does not reduce the drive strength during the first stage of gate drive. In other words, the variable strength multi-stage gate driver 134 controls the power switch S1 110 ON with a first drive strength and then a second drive strength. At time t21, the power switch S1 110 is controlled ON and indicates the beginning of the turn-on time. As shown, the diode current $I_{D1}$ 119 is non-zero at time $t_{21}$. In one example, the diode D1 118 has a slow recovery time. The diode current $I_{D1}$ 119 begins to sharply fall while the switch current $I_{SW}$ 116 begins to increase. The reverse recovery current spike is quite large due to the snap recovery of the output diode D1 118.

For the dashed lines at time $t_{22}$, the diode D1 118 recovers and diode current $I_{D1}$ 119 begins to change from its peak reverse recovery current toward zero, and the first terminal voltage $V_D$ 117 (e.g. the drain voltage of the power switch S1 110) begins to decrease from its value when the power switch S1 110 is open (e.g. off). Multiple oscillations may be seen in the first terminal voltage $V_D$ 117, which is also due to the large reverse recovery peak current and snappy recovery of the diode D1 118. At time $t_{23}$, the first terminal voltage $V_D$ 117 has reached substantially zero and the power switch S1 110 is fully turned ON and the turn-on time has ended. The period of time between times $t_{21}$ and $t_{23}$, illustrates the turn-on time $T_A$ 454 when variable strength multi-stage gate driver 134 turns ON the power switch S1 110 with the first strength (e.g. weak) during the first stage of turn-on and then the second strength (e.g. strong) during the second stage of turn-on.

The solid lines illustrate the diode current $I_{D1}$ 119, switch current $I_{SW}$ 116, and first terminal voltage $V_D$ 117 when the variable strength multi-stage gate driver 134 reduces the drive strength during the first stage of gate drive for the same operating conditions for the power converter 100 as the dashed lines. In other words, the variable strength multi-stage gate driver 134 controls the power switch S1 110 ON with a third drive strength (very weak) and then a second drive strength (strong). The third drive strength is weaker than the first drive strength used for the dashed lines. At time $t_{21}$, the power switch S1 110 is controlled ON and indicates the beginning of the turn-on time. The diode current $I_{D1}$ 119 begins to fall while the switch current $I_{SW}$ 116 begins to increase. As compared to the dashed lines, the decrease and increase in the diode current $I_{D1}$ 119 and switch current $I_{SW}$ 116 for the solid lines are more gentle.

For the solid lines at time $t_{24}$, the diode D1 118 recovers and diode current $I_{D1}$ 119 begins to change from its peak reverse recovery current toward zero, and the first terminal voltage $V_D$ 117 (e.g. the drain voltage of the power switch S1 110) begins to decrease. An initial peak can also be seen in the solid line switch current $I_{SW}$ 116, which is lower than the dashed line switch current $I_{SW}$ 116. Indicating that a "very slow" drive strength (e.g. third drive strength) can reduce the current spikes of the switch current $I_{SW}$ 116 due to the slow recovery of the diode D1 118. At time $t_{25}$, the first terminal voltage $V_D$ 117 has reached substantially zero and the power switch S1 110 is fully turned ON and the turn-on time has ended. The period of time between times $t_{23}$ and t25, illustrates the turn-on time $T_B$ 456 when variable strength multi-stage gate driver 134 turns ON the power switch S1 110 with the third strength (e.g. very weak) during the first stage of turn-on and then the second strength (e.g. strong) during the second stage of turn-on. As shown, the turn-on time $T_B$ 456 for very weak turn ON is longer than turn-on time $T_A$ 454 for weak turn on, however the amplitude of the current spike is smaller. The larger current spike in the switch current $I_{SW}$ 116 for turn-on time $T_A$ 454 for weak turn on can lead to increased switching losses and noise for the power switch S1 110.

Figure 5:
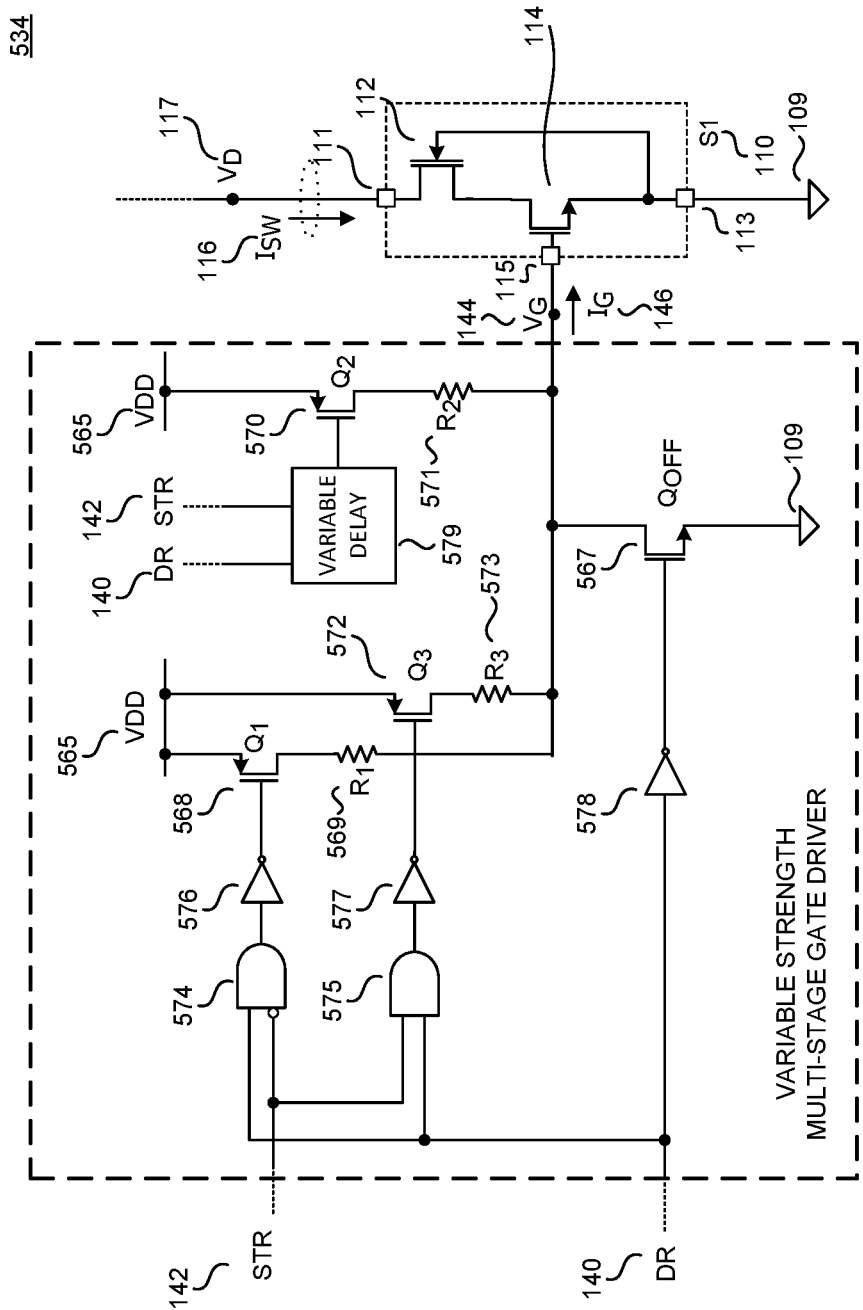
FIG. 5 is schematic illustrating one example of a variable strength multi-stage gate driver of FIGS. 1A and 2, in accordance with an embodiment of the present disclosure.

FIG. 5 illustrates one example of variable strength multi-stage gate driver 534, which is one example of variable strength multi-stage gate driver 134 shown in FIGS. 1A and 2. It should be appreciated that similarly named and numbered elements couple and function as described above, and the power switch S1 110 is shown for context. The variable strength multi-stage gate driver 534 includes supply voltage VDD 565, an off-transistor QOFF 567, first on-transistor Q1 568 and first resistor R1 569, second on-transistor Q2 570 and second resistor R2 571, third on-transistor Q3 572 and third resistor R3 573, AND gates 574 and 575, inverters 576, 577, and 578, and variable delay circuit 579. For the example shown, resistors R1 569, R2 571, and R3 573 are shown as external resistors, however it should be appreciated that resistors R1 569, R2 571, and R3 573 may be representative of the on-resistance ($R_{DSON}$) of their respective on-transistors Q1 568, Q2 570, and Q3 572, respectively.

On-transistor Q1 568 and resistor R1 569 are coupled between supply voltage D 565 and the control terminal 115 of power switch S1 110. When on-transistor Q1 568 is on, the power switch S1 110 is driven with the first drive strength (e.g. weak). On-transistor Q1 568 is exemplified as a p-channel MOSFET (PMOS) with the source of on-transistor Q1 568 coupled to supply voltage VDD 565 while the drain of on-transistor Q1 568 is coupled to control terminal 115. As will be further discussed, turning on-transistor Q1 568 corresponds to driving the power switch S1 110 with a first drive strength (e.g. weak)

On-transistor Q2 570 and resistor R2 570 are coupled between supply voltage VDD 565 and the control terminal 115 of power switch S1 110. When on-transistor Q2 570 is on, the power switch S1 110 is driven with the second drive strength (e.g. strong). On-transistor Q2 570 is exemplified as a PMOS transistor with the source of the on-transistor Q2 570 coupled to supply voltage VDD 565 and the drain of on-transistor Q2 570 coupled to the control terminal 115. Turning ON the on-transistor Q2 568 corresponds to driving the power switch S1 110 with the second drive strength (e.g. strong).

On-transistor Q3 572 and resistor R3 573 are coupled between supply voltage VDD 565 and the control terminal 115 of power switch S1 110. When on-transistor Q3 572 is on, the power switch S1 110 is driven with the third drive strength (e.g. very weak). In one example, the resistance of resistor R3 573 is greater than resistance of resistor R1 569. Further, resistance of resistor R1 569 is greater than resistance of resistor R2 571. On-transistor Q3 572 is exemplified as a PMOS transistor with the source of the on-transistor Q3 572 coupled to supply voltage VDD 565 and the drain of on-transistor Q3 572 coupled to the control terminal 115. Turning ON the on-transistor Q3 572 corresponds with driving the power switch S1 110 with the third drive strength (e.g. very weak).

On-transistor Q1 568 corresponds with providing the first drive strength (e.g. weak), while the on-transistor Q2 570 corresponds with providing the second drive strength (e.g. strong) and the on-transistor Q3 572 corresponds with providing the third drive strength (e.g. very weak). Each of the on-transistors Q1 568, Q2 570, and Q3 572 are coupled to the same supply voltage VDD 565. As such, the resistance of resistors R1 569, R2 571, and R3 573 or the value of the equivalent resistance, determines the drive strength when one or more of these transistors are on. The smaller the resistance, the smaller the voltage drop across the resistor, the greater the drive current $I_G$ 146, and the greater rate of change of the control voltage $V_G$ 144, and as such the stronger the drive strength of the variable strength multi-stage gate driver 534. The resistances of resistor R1 569, R2 571, and R3 573 are selected to correspond with the first, second, and third drive strength. In one example, the third resistor R3 573 has a greater resistance than the first resistor R1 569. The first resistor R1 569 has a greater resistance than the second resistor R2 571. In other words, the third resistor R3 573 has the largest resistance while the second resistor R2 571 has the smallest. In another example, resistance of resistor R3 573 is greater than the resistance of resistor R1 569 but the resistance of the second resistor R2 571 could be substantially the same as either of resistors R3 573 or R1 569, as the overall equivalent resistance is smaller once the third on-transistor Q3 572 is turned on.

Off-transistor QOFF 567 is shown as coupled between control terminal 115 and input return 109. Further, off-transistor QOFF 567 is exemplified as an n-type MOSFET (NMOS) with its drain coupled to the control terminal 115 and its source coupled to input return 109. As shown, the drive signal DR 140 is received by inverter 578. Inverter 578 is coupled to the control terminal of off-transistor QOFF 567.

AND gate 574 is coupled to receive the drive signal DR 140 and inverted strength signal STR 142, as shown by the small circle at the input of AND gate 574. The output of AND gate 574 is coupled to inverter 576 while inverter 576 is coupled to the control terminal of on-transistor Q1 568. AND gate 575 is coupled to receive the drive signal DR 140 and the strength signal STR 142. The output of AND gate 575 is coupled to inverter 577 while inverter 577 is coupled to the control terminal of on-transistor Q3 572.

Variable delay circuit 579 is coupled to receive the drive signal DR 140 and strength signal STR 142 and is configured to control the turn ON and OFF of the on-transistor Q2 570. In operation, the variable delay circuit 579 turns ON the on-transistor Q2 570 a delay after the drive signal DR 140 indicates a turn ON of the power switch S1 110. The length of the delay is responsive to the strength signal STR 142. If the strength signal STR 142 is not asserted, indicating DCM or CrM operation, the variable strength multi-stage gate driver 534 drives the first stage with the first drive strength. As such, the delay is substantially equal to first time period T1 458, discussed with respect to FIG. 4A. If the strength signal STR 142 is asserted, indicating CCM operation, the variable strength multi-stage gate driver 534 drives the first stage with the third drive strength. As such, the delay is substantially equal to first time period T2 464, discussed with respect to FIG. 4A.

In one example, logic high values for the drive signal DR 140 correspond with turning ON the power switch S1 110 while logic low values correspond with turning OFF the power switch S1 110. Similarly, logic high values for the strength signal STR 142 indicates reducing the drive strength of the first stage of the variable strength multi-stage gate driver 534. In operation, when the drive signal DR 140 transitions to a logic high value and the strength signal STR 142 is logic low (e.g. not asserted), the output of AND gate 574 is logic high and as such the control terminal of the on-transistor Q1 568 is logic low, turning ON the on-transistor Q1 568. Further, the output of AND gate 575 is logic low and as such the control terminal of the on-transistor Q3 572 is logic high and transistor Q3 572 is off. As such, the power switch S1 110 is driven with the first drive strength (e.g. weak). Since the strength signal STR 142 is logic low (e.g. not asserted), the variable delay circuit 579 turns ON the on-transistor Q2 570 a delay time substantially equal to first time period T1 458. Once the on-transistor Q2 570 is turned on, the power switch S1 110 is driven with the second drive strength (e.g. strong).

When the drive signal DR 140 transitions to a logic high value and the strength signal STR 142 is logic high (e.g. asserted), the output of AND gate 575 is logic high and as such the control terminal of the on-transistor Q3 572 is logic low, turning ON the on-transistor Q3 572. Further, the output of AND gate 574 is logic low and as such the control terminal of the on-transistor Q1 568 is logic high and transistor Q1 568 is off. As such, the power switch S1 110 is driven with the third drive strength (very weak). Since the strength signal STR 142 is logic high (e.g. asserted), the variable delay circuit 579 turns ON the on-transistor Q2 570 a delay time substantially equal to the second time period T2 464. Once the on-transistor Q2 570 is turned on, the power switch S1 110 is driven with the second drive strength (e.g. strong).

When the drive signal DR 150 transitions to a logic low value, on-transistors Q1 568, Q2 570 and Q3 572 are turned off. The control terminal of off-transistor QOFF 567 is logic high, turning ON the off-transistor QOFF 567, which couples the control terminal 115 to input return 109, turning OFF the power switch S1 110.

Figure 6:
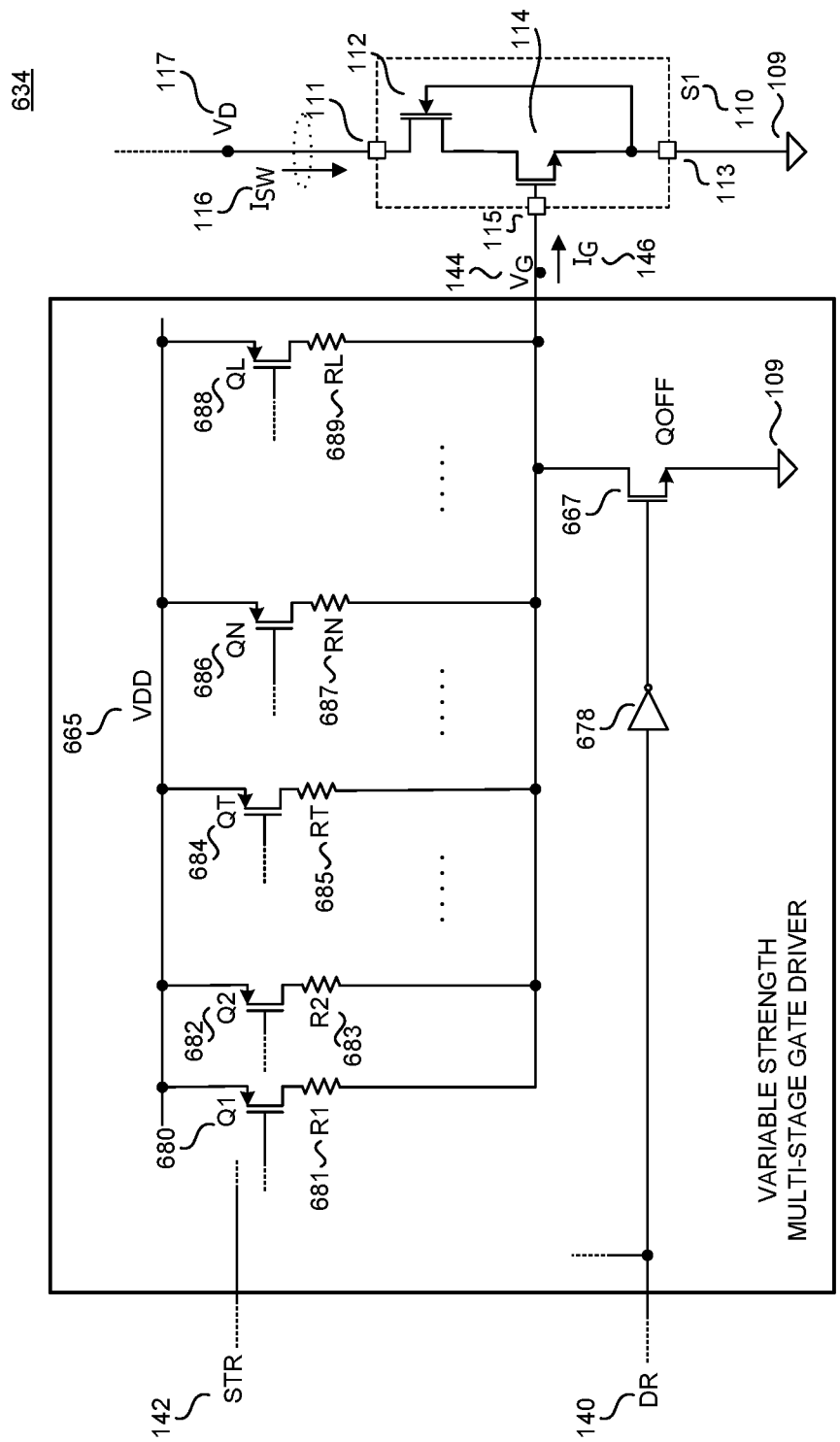
FIG. 6 is schematic illustrating another example of a variable strength multi-stage gate driver of FIGS. 1A and 2, in accordance with an embodiment of the present disclosure.

FIG. 6 illustrates another example of variable strength multi-stage gate driver 634, which is one example of variable strength multi-stage gate driver 134 shown in FIGS. 1A and 2. It should be appreciated that similarly named and numbered elements couple and function as described above, and the power switch S1 110 is shown for context. The variable strength multi-stage gate driver 634 includes supply voltage VDD 665, an L number of parallel coupled on-transistors Q1 680, Q2 682 to QL 688 and corresponding L number of resistors R1 681, R2 683 to RL 689, off-transistor QOFF 667, and inverter 678.

For the example shown, on-transistor Q1 680 and resistor R1 681 are coupled between the supply voltage VDD 665 and control terminal 115. Similarly, on-transistor Q2 682 and resistor R2 683 are coupled between the supply voltage VDD 665 and control terminal 115 and so on for each of the L number of on-transistors and resistors shown. Further, resistors R1 681, R2 683 to RL 689 are shown as external resistors, however it should be appreciated that resistors R1 681, R2 683 to RL 689 may be representative of the on-resistance ($R_{DSON}$) of their respective on-transistors Q1 680, Q2 682 to QL 688, respectively. On-transistors Q1 680, Q2 682 to QL 688 are exemplified as PMOS transistors. Further, in one embodiment, each similarly numbered transistor and resistor could represent a layout finger of a PMOS transistor. In addition, the resistances of resistors R1 681, R2 683 to RL 689 may be substantially the same.

As shown, the variable strength multi-stage gate driver 634 receives the drive signal DR 140 and strength signal STR 142. In one example, logic high values for the drive signal DR 140 correspond with turning ON the power switch S1 110 while logic low values correspond with turning OFF the power switch S1 110. Similarly, logic high values for the strength signal STR 142 indicates reducing the drive strength of the first stage of the variable strength multi-stage gate driver 534.

In one embodiment, a logic high value for both the drive signal DR 140 and strength signal STR 142 indicates driving the power switch S1 110 with the third drive strength. When the variable strength multi-stage gate driver 634 is driving the power switch S1 110 with the third drive strength (e.g. very weak), the variable strength multi-stage gate driver 634 turns on T number of transistors, e.g. the on-transistors Q1 680, Q2 682 to QT 684. The equivalent resistance to drive the power switch S1 110 with the third drive strength (e.g. very weak) is the equivalent resistance of T number of parallel coupled resistors R1 681, R2 683, to RT 685.

A logic high value for the drive signal DR 140 but logic low value for the strength signal STR indicates driving the power switch S1 110 with the first drive strength. When the variable strength multi-stage gate driver 634 is driving the power switch S1 110 with the first drive strength (e.g. weak), the variable strength multi-stage gate driver 634 turns ON N number of on-transistors Q1 680, Q2 682 to QN 686, including the T number of transistors turned ON for the third drive strength (e.g. very weak). The equivalent resistance to drive the power switch S1 110 with the first drive strength (e.g. weak) is the equivalent resistance of the N number of parallel coupled resistors R1 681, R2 683, to RN 687, including the T number of resistors R1 681, R2 683, to RT 685. In one example, N is greater than T and the equivalent resistance for N number of parallel coupled resistors is smaller than T number of parallel coupled resistors and as such the driver strength is stronger.

After either a delay time substantially equal to first time period T1 458 or second time period T2 464, depending on whether the strength signal STR 142 is asserted, the variable strength multi-stage gate driver 634 drives the power switch S1 110 with the second drive strength (e.g. strong). The variable strength multi-stage gate driver 634 turns ON L number of on-transistors Q1 680, Q2 682 to QL 688, including the N number of transistors turned ON for the first drive strength (e.g. weak) and the T number of transistors turned ON for the third drive strength (e.g. very weak). The equivalent resistance to drive the power switch S1 110 with the second drive strength (e.g. strong) is the equivalent resistance of the L number of parallel coupled resistors R1 681, R2 683, to RL 689, including the N number of resistors R1 681, R2 683, to RN 687. In one example, L is greater than N and greater than T and the equivalent resistance for L number of parallel coupled resistors is smaller than the N number of parallel coupled resistors and the T number of parallel coupled resistors and as such the driver strength is stronger.

When the drive signal DR 150 transitions to a logic low value, on-transistors Q1 680, Q2 682 to QL 688 are turned off. The control terminal of off-transistor QOFF 667 is logic high, turning ON the off-transistor QOFF 667, which couples the control terminal 115 to input return 109, turning OFF the power switch S1 110.

In another embodiment, the number of PMOS fingers turned ON for the first drive strength (e.g. weak) and the third drive strength (e.g. very weak) is substantially the same as described above. However, the variable strength multi-stage gate driver 634 turns on transistors QN+1 (not shown) to QL 688 during the second stage for the second drive strength. For a second stage following a first stage driven with the first drive strength, L number of transistors Q1 680 to QL 688 are turned ON. For a second stage following a first stage driven with the third drive strength, transistors Q1 680 to QT 684 and transistors QN+1 to QL 688 are turned ON while transistors QT+1 (not shown) to QN 686 are OFF The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples:

Example 1. A controller for use with a power converter, the controller comprising a drive signal generator and drive strength control coupled to receive a feedback signal representative of an output of the power converter, wherein the drive signal generator and drive strength control is configured to output a drive signal to control the switching of a power switch of the power converter in response to the feedback signal, and output a strength signal to control drive strength of the power switch, and wherein the strength signal is asserted in response to determined continuous conduction mode (CCM) operation; and a variable strength multi-stage gate driver coupled to receive the drive signal and the strength signal, wherein the variable strength multi-stage gate driver is configured to turn ON the power switch in response to the drive signal with a first drive strength for a first stage and a second drive strength for a second stage when the strength signal is not asserted, wherein the variable strength multi-stage gate driver is configured to turn ON the power switch in response to the drive signal with a third drive strength for the first stage and the second drive strength for the second stage when the strength signal is asserted, and wherein the second drive strength is stronger than the first drive strength and the first drive strength is stronger than the third drive strength.

Example 2. The controller of example 1, wherein the variable strength multi-stage gate driver provides the first drive strength for a first time period prior to providing the second drive strength when the strength signal is not asserted, wherein the variable strength multi-stage gate driver provides the third drive strength for a second time period prior to providing the second strength when the strength signal is asserted.

Example 3. The controller of examples 1 or 2, wherein the variable strength multi-stage gate driver comprises: a first on-transistor and a first resistance coupled to a supply voltage and a control terminal of the power switch, wherein the first on-transistor is turned ON when the drive signal indicates to turn ON the power switch and the strength signal is not asserted to provide the first drive strength; a second on-transistor and a second resistance coupled to the supply voltage and the control terminal, wherein the second on-transistor is turned ON after the first time period when the drive signal indicates to turn ON the power switch and the strength signal is not asserted to provide the second drive strength; and a third on-transistor and a third resistance coupled to the supply voltage and the control terminal, wherein the third on-transistor is turned ON for the second time period and the second on-transistor is turned ON after the second time period when the drive signal indicates to turn ON the power switch and the strength signal is asserted to provide the third drive strength, wherein the third resistance is greater than the first resistance.

Example 4. The controller of any one of examples 1 to 3, wherein the second resistance is less than or equal to the first resistance.

Example 5. The controller of any one of examples 1 to 4, wherein the first resistance, second resistance, and third resistance are internal drain-source resistances of the first on-transistor, the second on-transistor, and the third on-transistor.

Example 6. The controller of any one of examples 1 to 5, wherein the variable strength multi-stage gate driver comprises a plurality of on-transistors and resistances, wherein each on-transistor and resistance of the plurality of on-transistors and resistances is coupled between a supply voltage and a control terminal of the power switch, wherein the variable strength multi-stage gate driver is configured to turn ON a first set of the plurality of on-transistors when the drive signal indicates to turn ON the power switch and the strength signal is asserted to provide the third drive strength, wherein the variable strength multi-stage gate driver is configured to turn ON a second set of the plurality of on-transistors when the drive signal indicates to turn ON the power switch and the strength signal is not asserted to provide the first drive strength, wherein the second set includes the first set.

Example 7. The controller of any one of examples 1 to 6, wherein the variable strength multi-stage gate driver is configured to turn on the plurality of on-transistors to provide the second drive strength.

Example 8. The controller of any one of examples 1 to 7, wherein the turn ON of the plurality of on-transistors to provide the second drive strength occurs after the first time period after the drive signal indicates turn ON of the power switch if the strength signal is not asserted, wherein the turn ON of the plurality of on-transistors to provide the second drive strength occurs after the second time period after the drive signal indicates turn ON of the power switch if the strength signal is asserted, wherein the second time period is longer than the first time period.

Example 9. The controller of any one of examples 1 to 8, wherein the variable strength multi-stage gate driver is configured to turn ON a third set of the plurality of on-transistors after a delay period after the drive signal indicates to turn on the power switch to provide the second drive strength.

Example 10. The controller of any one of examples 1 to 9, wherein the plurality of resistances are substantially equal.

Example 11. The controller of any one of examples 1 to 10, wherein the plurality of resistances are drain-source resistances for each of the plurality of on-transistors.

Example 12. The controller of any one of examples 1 to 11, wherein the controller further comprises: a synchronization circuit configured to receive a voltage sense signal representative of a voltage of an energy transfer element of the power converter and to output a comparison signal to the drive signal generator and drive strength control, wherein the drive signal generator and drive strength control determines CCM operation if the comparison signal indicates the voltage sense signal is greater than a reference at the end of an off-time of the power switch.

Example 13. The controller of any one of examples 1 to 12, wherein the synchronization circuit is further configured to output an extremum signal, wherein the extremum signal indicates a sensed extremum in the voltage sense signal.

Example 14. The controller of any one of examples 1 to 13, wherein the drive signal generator and drive strength control is configured to output the drive signal to turn ON the power switch coincident with the sensed extremum or an off-time of the power switch reaching a maximum off-time.

Example 15. The controller of any one of examples 1 to 14, wherein the power converter is a boost converter.

Example 16. The controller of any one of examples 1 to 15, wherein the power switch is a cascode switch comprising a first cascode switch and a second cascode switch.

What is claimed is:

1. A controller for use with a power converter, the controller comprising:
    a drive signal generator and drive strength control coupled to receive a feedback signal representative of an output of the power converter,
        wherein the drive signal generator and drive strength control is configured to output a drive signal to control the switching of a power switch of the power converter in response to the feedback signal, and output a strength signal to control drive strength of the power switch, and
        wherein the strength signal is asserted in response to determined continuous conduction mode (CCM) operation; and
    a variable strength multi-stage gate driver coupled to receive the drive signal and the strength signal,
        wherein the variable strength multi-stage gate driver is configured to turn ON the power switch in response to the drive signal with a first drive strength for a first stage and a second drive strength for a second stage when the strength signal is not asserted,
        wherein the variable strength multi-stage gate driver is configured to turn ON the power switch in response to the drive signal with a third drive strength for the first stage and the second drive strength for the second stage when the strength signal is asserted, and
        wherein the second drive strength is stronger than the first drive strength and the first drive strength is stronger than the third drive strength.

2. The controller of claim 1, wherein the variable strength multi-stage gate driver provides the first drive strength for a first time period prior to providing the second drive strength when the strength signal is not asserted, wherein the variable strength multi-stage gate driver provides the third drive strength for a second time period prior to providing the second strength when the strength signal is asserted.

3. The controller of claim 2, wherein the variable strength multi-stage gate driver comprises:
    a first on-transistor and a first resistance coupled to a supply voltage and a control terminal of the power switch,
        wherein the first on-transistor is turned ON when the drive signal indicates to turn ON the power switch and the strength signal is not asserted to provide the first drive strength;
    a second on-transistor and a second resistance coupled to the supply voltage and the control terminal,
        wherein the second on-transistor is turned ON after the first time period when the drive signal indicates to turn ON the power switch and the strength signal is not asserted to provide the second drive strength; and
    a third on-transistor and a third resistance coupled to the supply voltage and the control terminal, wherein the third on-transistor is turned ON for the second time period and the second on-transistor is turned ON after the second time period when the drive signal indicates to turn ON the power switch and the strength signal is asserted to provide the third drive strength, wherein the third resistance is greater than the first resistance.

4. The controller of claim 3, wherein the second resistance is less than or equal to the first resistance.

5. The controller of claim 3, wherein the first resistance, second resistance, and third resistance are internal drain-source resistances of the first on-transistor, the second on-transistor, and the third on-transistor.

6. The controller of claim 2, wherein the variable strength multi-stage gate driver comprises a plurality of on-transistors and resistances,
wherein each on-transistor and resistance of the plurality of on-transistors and resistances is coupled between a supply voltage and a control terminal of the power switch,
wherein the variable strength multi-stage gate driver is configured to turn ON a first set of the plurality of on-transistors when the drive signal indicates to turn ON the power switch and the strength signal is asserted to provide the third drive strength,
wherein the variable strength multi-stage gate driver is configured to turn ON a second set of the plurality of on-transistors when the drive signal indicates to turn ON the power switch and the strength signal is not asserted to provide the first drive strength, wherein the second set includes the first set.

7. The controller of claim 6, wherein the variable strength multi-stage gate driver is configured to turn on the plurality of on-transistors to provide the second drive strength.

8. The controller of claim 7, wherein the turn ON of the plurality of on-transistors to provide the second drive strength occurs after the first time period after the drive signal indicates turn ON of the power switch if the strength signal is not asserted, wherein the turn ON of the plurality of on-transistors to provide the second drive strength occurs after the second time period after the drive signal indicates turn ON of the power switch if the strength signal is asserted, wherein the second time period is longer than the first time period.

9. The controller of claim 6, wherein the variable strength multi-stage gate driver is configured to turn ON a third set of the plurality of on-transistors after a delay period after the drive signal indicates to turn on the power switch to provide the second drive strength.

10. The controller of claim 6, wherein the plurality of resistances are substantially equal.

11. The controller of claim 6, wherein the plurality of resistances are drain-source resistances for each of the plurality of on-transistors.

12. The controller of claim 1, wherein the controller further comprises:
a synchronization circuit configured to receive a voltage sense signal representative of a voltage of an energy transfer element of the power converter and to output a comparison signal to the drive signal generator and drive strength control,
wherein the drive signal generator and drive strength control determines CCM operation if the comparison signal indicates the voltage sense signal is greater than a reference at the end of an off-time of the power switch.

13. The controller of claim 12, wherein the synchronization circuit is further configured to output an extremum signal, wherein the extremum signal indicates a sensed extremum in the voltage sense signal.

14. The controller of claim 13, wherein the drive signal generator and drive strength control is configured to output the drive signal to turn ON the power switch coincident with the sensed extremum or an off-time of the power switch reaching a maximum off-time.

15. The controller of claim 1, wherein the power converter is a boost converter.

16. The controller of claim 1, wherein the power switch is a cascode switch comprising a first cascode switch and a second cascode switch.

* * * * *